(12) United States Patent
Mashiko

(10) Patent No.: US 8,069,875 B2
(45) Date of Patent: Dec. 6, 2011

(54) VENTILATION MEMBER, VENTILATION MEMBER KIT, AND VENTED HOUSING AND VENTED TANK USING THEM

(75) Inventor: Hiroaki Mashiko, Osaka (JP)

(73) Assignee: Nitto Denko Corporation, Osaka (JP)

( * ) Notice: Subject to any disclaimer, the term of this patent is extended or adjusted under 35 U.S.C. 154(b) by 947 days.

(21) Appl. No.: 11/921,473

(22) PCT Filed: Jun. 2, 2006

(86) PCT No.: PCT/JP2006/311121
§ 371 (c)(1),
(2), (4) Date: Dec. 3, 2007

(87) PCT Pub. No.: WO2006/129805
PCT Pub. Date: Dec. 7, 2006

(65) Prior Publication Data
US 2009/0120949 A1    May 14, 2009

(30) Foreign Application Priority Data

Jun. 3, 2005 (JP) .................................. 2005-164114

(51) Int. Cl.
*F16K 15/14* (2006.01)
*F21V 31/03* (2006.01)

(52) U.S. Cl. .......................... 137/512; 137/846; 362/547

(58) Field of Classification Search .................. 137/512, 137/846; 96/108, 110, 113, 153, 154; 362/294, 362/547
See application file for complete search history.

(56) References Cited

U.S. PATENT DOCUMENTS

| | | | | |
|---|---|---|---|---|
| 2,138,605 A | * | 11/1938 | Landis | 137/512 |
| 2,554,879 A | * | 5/1951 | Race, Jr. | 96/117.5 |
| 4,255,591 A | * | 3/1981 | Makin et al. | 562/517 |
| 4,796,163 A | | 1/1989 | Dressler | |
| 5,016,445 A | * | 5/1991 | Wehr | 62/101 |
| 5,665,146 A | | 9/1997 | Mizobe | |
| 5,868,667 A | * | 2/1999 | Lin et al. | 600/133 |
| 5,903,802 A | * | 5/1999 | Watanabe et al. | 399/98 |
| 6,364,924 B1 | | 4/2002 | Mashiko et al. | |
| 6,422,729 B1 | | 7/2002 | Rohrbach et al. | |

FOREIGN PATENT DOCUMENTS

| | | |
|---|---|---|
| DE | 43 04 789 A1 | 8/1994 |
| JP | 4-049403 | 4/1992 |
| JP | 7-068124 | 3/1995 |
| JP | 2001-143524 | 5/2001 |
| JP | 2003-521803 | 7/2003 |

* cited by examiner

*Primary Examiner* — John Rivell
(74) *Attorney, Agent, or Firm* — Hamre, Schumann, Mueller & Larson, P.C.

(57) ABSTRACT

A ventilation member and a ventilation member kit are provided that can extend the time until fogging will be produced in a housing and also can shorten the time until the produced fogging will be cleared up even when the interior of the housing has been fogged. A vented housing and a vented tank using them are also provided. A ventilation member includes: a first gas permeable membrane, a second gas permeable membrane, and an absorbing layer allowing a gas passing through an opening of a housing or a tank to permeate therethrough, with the ventilation member being fixed to the opening; a support body for supporting the first gas permeable membrane, the second gas permeable membrane, and the absorbing layer; and a first one-way valve disposed so as to cover the first gas permeable membrane. The first gas permeable membrane and the second gas permeable membrane are disposed in such a manner that the gas permeates through the gas permeable membranes independently of each other. The second gas permeable membrane and the absorbing layer are disposed in such a manner that the gas permeates through the second gas permeable membrane and the absorbing layer successively. The absorbing layer contains a water absorbent.

20 Claims, 13 Drawing Sheets

VENTILATION MEMBER, VENTILATION MEMBER KIT, AND VENTED HOUSING AND VENTED TANK USING THEM

TECHNICAL FIELD

The present invention relates to a ventilation member and a ventilation member kit that are fixed to a tank, or to a housing for electrical components (typically automobile electrical components) for ensuring ventilation between the interior and the exterior of the tank or the housing and suppressing the entry of foreign matter into the interior of the tank or the housing. The invention also relates to a vented housing and a vented tank in which the ventilation member and/or the ventilation member kit is/are fixed.

BACKGROUND ART

Conventionally, ventilation members are attached to housings of electric appliances such as mobile telephones, cameras, and of automobile electrical components including lamps, pressure sensors, and ECUs (Electrical Control Units), in order to ensure ventilation between the interior and the exterior of the housings and to prevent the entry of foreign matter into the interior of the housings. Attaching such ventilation members to the housings makes it possible to prevent the entry of water, dust, and the like into the interior of the housings and at the same time to achieve the following; the pressure change inside the housing associated with temperature change can be alleviated, sound can be transmitted between the interior and the exterior of the housing, and the gas produced in the interior of the housing can be discharged to the exterior of the housing.

One example of such a ventilation member is disclosed in JP 2001-143524A (Document 1). A ventilation member 101 disclosed in Document 1 has, as shown in FIG. 16, a tubular support body 103 and a closed-bottomed protective cover 104. A gas permeable membrane 102 is disposed on one end face of the tubular support body 103. The protective cover 104 is fitted to the support body 103 so as to cover the gas permeable membrane 102. The ventilation member 101 is fixed to a housing 105 so as to cover an opening 106 of the housing 105, and gas is allowed to permeate through the gas permeable membrane 102 so that ventilation between the interior and the exterior of the housing 105 is ensured. The protective cover 104 is provided in order to prevent the breakage of the gas permeable membrane 102 caused by, for example, contact with foreign objects.

The conventional ventilation member 101, however, allows the gas inside the housing 105 and the gas outside the housing 105 to be in communication with each other via the gas permeable membrane 102 at all times, and therefore, water vapor outside the housing 105 may enter the interior of the housing 105, producing water droplets on the inner surface of the housing 105 (i.e., fogging the inner surface of the housing 105). For example, when the housing is a lamp that is one type of automobile electrical components, the water droplets (fogging) can become a cause of reducing the light intensity of the light emitted from the lamp. Such fogging is apt to occur by turning off the lamp when the air temperature is low and the humidity of the exterior the housing is high (for example, when it is raining or snowing in winter). From the viewpoint of improving the automobile's safety, there is a need for a ventilation member that can extend the time until the fogging will be produced and that allows the fogging to disappear quickly after turning on the lamp, for example, even if the fogging is produced. The same characteristics have been required for the ventilation members used for other kinds of housings.

It is possible to delay the generation of water droplets (production of fogging) by reducing the gas permeable area of the gas permeable membrane provided for the ventilation member to decrease the amount of the water vapor that enters the interior of the housing per unit time; however, in this method, the amount of the water vapor discharged to the exterior of the housing per unit time also decreases simultaneously, and therefore, it takes a long time before the generated water droplets disappear (i.e., until fogging will be cleared up). In addition, when electricity is passed through an electrical component, such as a lamp, in which the interior of the housing heats up during electricity application, when fogging has been produced therein, the water droplets are heated and water vapor is produced; however, the ventilation member provided with a gas permeable membrane having a small gas permeable area requires a long time to release the produced water vapor to the exterior of the housing.

When such a conventional ventilation member is attached to a tank (such as a bottle for chemicals, an organic solvent tank, and a gas tank), it is possible to obtain similar advantageous effects to those in the case where the ventilation member is attached to the housing, while preventing the entry of water, dust, and the like into the tank.

However, when the conventional ventilation member 101 is attached to a tank, the gas inside the tank and the gas outside the tank are in communication with each other via the gas permeable membrane 102 at all times, as in the case where the conventional ventilation member 101 is attached to the housing 105. Consequently, water vapor outside the tank may enter the interior of the tank, causing adverse effects on the liquid accommodated in the tank or causing moisture to accumulate in the tank.

DISCLOSURE OF THE INVENTION

Accordingly, it is an object of the present invention to provide a ventilation member that can extend the time until fogging will be produced in the housing and shorten the time until the produced fogging will be cleared up even when the interior of the housing has been fogged, by allowing the ventilation member to have a structure that has not been available before. It is also an object of the invention to provide a vented housing using the just-mentioned ventilation member.

It is also an object of the present invention to provide a ventilation member that can reduce the amount of water vapor entering the interior of a tank and can discharge the gas in the tank quickly to the exterior of the tank when the pressure inside the tank increases, by allowing the ventilation member to have a structure that has not been available before. It is also an object of the invention to provide a vented tank that uses the just-mentioned ventilation member.

A ventilation member according to the present invention includes: a first gas permeable membrane, a second gas permeable membrane, and an absorbing layer allowing a gas passing through an opening of a housing or a tank to permeate therethrough, with the ventilation member being fixed to the opening; a support body for supporting the first gas permeable membrane, the second gas permeable membrane, and the absorbing layer; and a first one-way valve disposed so as to cover the first gas permeable membrane. The first gas permeable membrane and the second gas permeable membrane are disposed in such a manner that the gas permeates through the gas permeable membranes independently of each other. The second gas permeable membrane and the absorbing layer are disposed in such a manner that the gas permeates through the second gas permeable membrane and the absorbing layer successively. The absorbing layer contains a water absorbent.

A ventilation member kit according to the present invention includes: a first ventilation member comprising a first gas permeable membrane allowing a gas passing through a first opening of a housing or a tank to permeate therethrough, with the first ventilation member being fixed to the first opening, a first support body for supporting the first gas permeable membrane, and a first one-way valve disposed so as to cover the first gas permeable membrane; and a second ventilation member comprising a second gas permeable membrane and an absorbing layer allowing a gas passing through a second opening of the housing or the tank to permeate therethrough, with the second ventilation member being fixed to the second opening, and a second support body for supporting the second gas permeable membrane and the absorbing layer, wherein in the second ventilation member, the second gas permeable membrane and the absorbing layer are disposed in such a manner that the gas permeates through the second gas permeable membrane and the absorbing layer successively, and the absorbing layer contains a water absorbent.

A vented housing according to the present invention is a vented housing having an opening for allowing gas to pass therethrough, and includes the foregoing ventilation member according to the present invention. The ventilation member is fixed to the opening in such a manner that a gas flow direction of the first one-way valve of the ventilation member is a direction in which the gas passes from an interior to an exterior of the housing.

In another embodiment, a vented housing according to the present invention is a vented housing having first and second openings for allowing gas to pass therethrough, and includes the foregoing ventilation member kit according to the present invention. The first ventilation member of the ventilation member kit is fixed to the first opening in such a manner that a gas flow direction of the first one-way valve of the first ventilation member is a direction in which the gas passes from an interior to an exterior of the housing. The second ventilation member of the ventilation member kit is fixed to the second opening.

A vented tank according to the present invention is a vented tank having an opening for allowing gas to pass therethrough, and includes the foregoing ventilation member according to the present invention. The ventilation member is fixed to the opening in such a manner that a gas flow direction of the first one-way valve of the ventilation member is a direction in which the gas passes from an interior to an exterior of the tank.

In another embodiment, a vented tank according to the present invention is a vented tank having first and second openings for allowing gas to pass therethrough, and includes the foregoing ventilation member kit according to the present invention. The first ventilation member of the ventilation member kit is fixed to the first opening in such a manner that a gas flow direction of the first one-way valve of the first ventilation member is a direction in which the gas passes from an interior to an exterior of the tank. The second ventilation member of the ventilation member kit is fixed to the second opening.

The present invention makes it possible to extend the time until fogging will be produced in a housing and to shorten the time until the produced fogging will be cleared up even when the interior of the housing has been fogged, by employing a one-way valve (check valve) and an absorbing layer containing a water absorbent to control the gas flow from the exterior to the interior of the housing and the gas flow from the interior to the exterior of the housing.

In addition, the present invention makes it possible to reduce the amount of water vapor that enters the interior of a tank and to discharge a gas in the tank quickly to the exterior of the tank when the pressure inside the tank increases, by employing a one-way valve (check valve) and an absorbing layer containing a water absorbent to control the gas flow from the exterior to the interior of the tank and the gas flow from the interior to the exterior of the tank.

These advantageous effects also are obtained by the ventilation member kit provided with a ventilation member (first ventilation member) having the one-way valve and a ventilation member (second ventilation member) having the absorbing layer.

BEST MODE FOR CARRYING OUT THE INVENTION

Figure 1A:
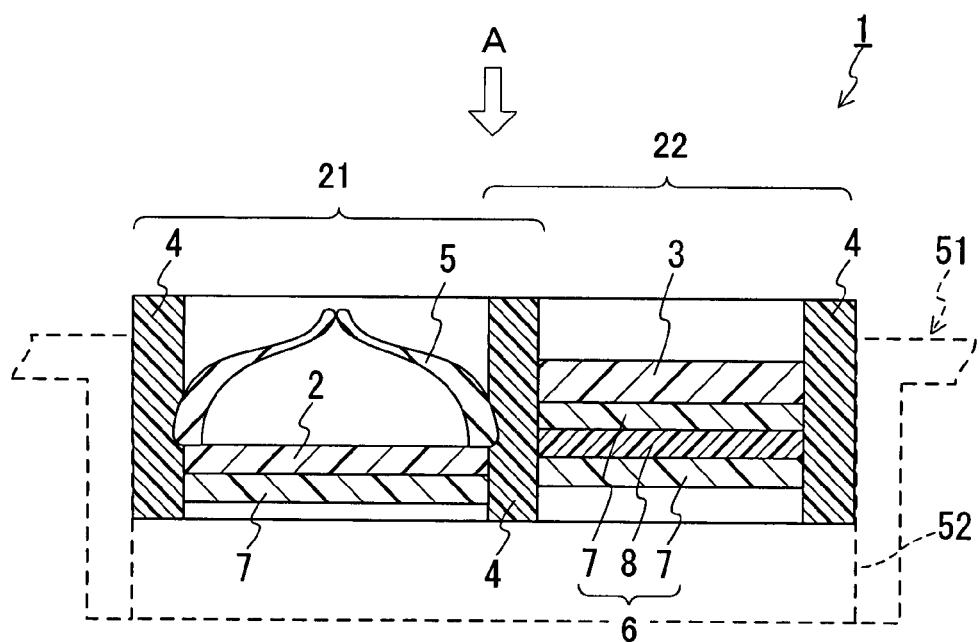
FIG. 1A is a cross-sectional view schematically illustrating one example of the ventilation member according to the present invention.

Hereinbelow, preferred embodiments of the present invention are described with reference to the drawings. In the following description, the same parts are designated by the same reference numerals, and the repetitive description thereof may be omitted.

Figure 1B:
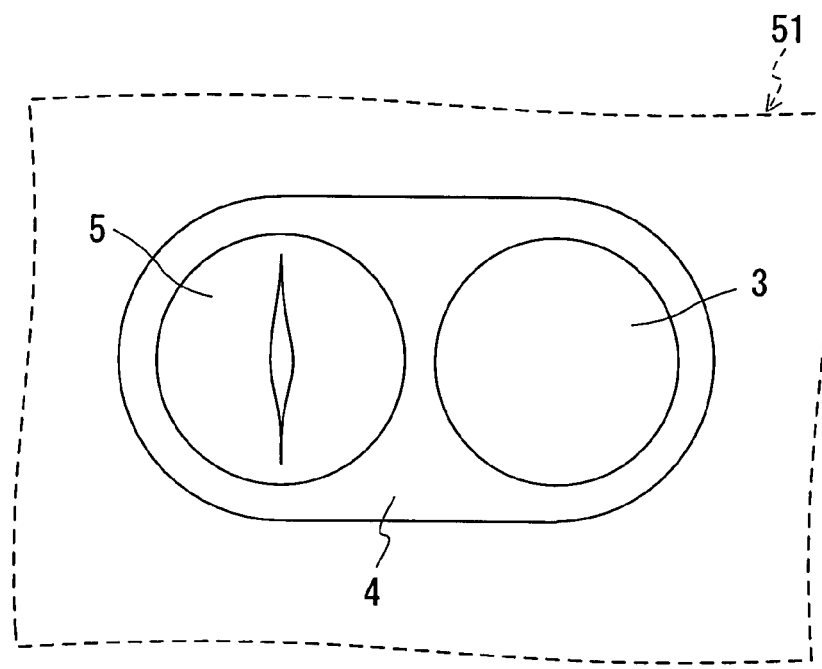
FIG. 1B is a schematic view of the ventilation member shown in FIG. 1A, viewed from the top.

One example of the ventilation member according to the present invention is illustrated in FIGS. 1A and 1B.

A ventilation member 1 shown in FIGS. 1A and 1B is provided with a first gas permeable membrane 2, a second gas permeable membrane 3, and a support body 4 for supporting the first and the second gas permeable membranes. The support body 4 is inserted in and fixed to an opening 52 of a housing 51. The first gas permeable membrane 2 and the second gas permeable membrane 3 are juxtaposed in the opening 52. The gas passing through the opening 52 can permeate through the gas permeable membranes independently. The ventilation member 1 further is provided with a first one-way valve 5 (check valve) supported by the support body 4 so as to cover the first gas permeable membrane, and an absorbing layer 6 containing a water absorbent for absorbing the moisture contained in the gas that passes through the opening 52. The absorbing layer 6 and the second gas permeable membrane 3 are disposed so that the above-mentioned gas permeates through the second gas permeable membrane 3 and the absorbing layer 6 successively (in whichever order). The gas flow direction of the first one-way valve 5 is in a direction in which the gas passes from the interior to the exterior of the housing 51 with the ventilation member 1 being fixed to the opening 52 of the housing 51.

It can be said that the ventilation member 1 is a ventilation member in which a first ventilation member 21 provided with the first one-way valve 5 and a second ventilation member 22 provided with the absorbing layer 6 are integrated. It also can be said that the gas passage of the first ventilation member 21 and the gas passage of the second ventilation member 22 are independent of each other, when focusing on the gas permeable membranes provided for the respective ventilation members. It also can be said that the one-way valve 5 is disposed in the gas passage of the first ventilation member 21 and that the second gas permeable membrane 3 and the absorbing layer 6 are disposed on the gas passage of the second ventilation member 22. It should be noted that in FIG. 1B, the ventilation member 1 shown in FIG. 1A is viewed from the top (in other words, viewed in the direction along the arrow A in FIG. 1A), and FIG. 1B shows the state in which the one-way valve 5 is open for clarity in illustration (in FIG. 1A, the one-way valve 5 is closed). It is likewise in FIG. 8B, which will be referred to later.

When the interior of the housing 51 becomes a negative pressure condition relative to the external environment, the gas tends to move from the exterior toward the interior of the housing 51. However, the one-way valve 5 closes up at this point, so the gas is led to permeate through the second gas permeable membrane 3 and the absorbing layer 6 and is introduced into the interior of the housing 51 (i.e., the gas is introduced through the second ventilation member 22 to the interior of the housing 51). At this time, the gas in which the amount of moisture is reduced by the absorbing layer 6 is introduced into the interior of the housing 51, and therefore, the time until fogging will be produced in the housing 51 can be extended. It is also possible to prevent the production of fogging in the housing 51 by optimizing the type and amount of the water absorbent contained in the absorbing layer 6.

Conversely, when the interior of the housing 51 becomes a pressurized condition relative to the external environment, the gas tends to move from the interior toward the exterior of the housing 51. And, the one-way valve 5 opens up at this point, so the gas is allowed to permeate through both the first permeable membrane 2 and the second gas permeable membrane 3 and is discharged to the exterior of the housing 51 (i.e., the gas is discharged to the exterior of the housing 51 via the first ventilation member 21 and the second ventilation member 22). Thus, even when fogging is developed in the housing 51, the fogging can be cleared quickly since the gas within the housing 51 can be discharged quickly. Moreover, it is possible to prevent an excessive pressure increase in the housing 51.

Figure 2:
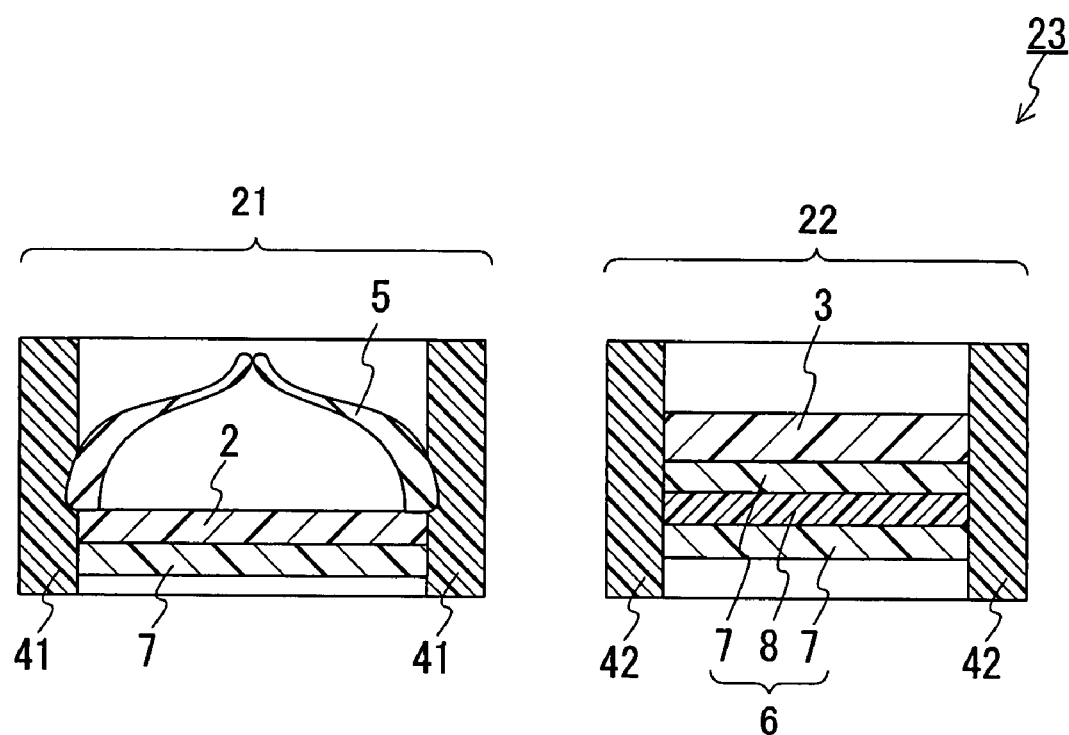
FIG. 2 is a cross-sectional view schematically illustrating one example of the ventilation member kit according to the present invention.

The first ventilation member 21 and the second ventilation member 22 may not necessarily be integrated with each other. As illustrated in FIG. 2, the first ventilation member 21 and the second ventilation member 22 may be separated from each other to form a ventilation member kit 23. In the ventilation member kit 23 shown in FIG. 2, the first gas permeable membrane 2 is supported by a first support body 41, and the second gas permeable membrane 3 and the absorbing layer 6 are supported by a second support body 42. The support body 41 and the support body 42 are fixed respectively to a first opening and a second opening of a housing, independently of each other.

The structure of the first one-way valve 5 is not particularly limited. The one-way valve 5 shown in FIG. 1 is made of an elastic material. This type of valve has the advantages as follows; it is highly adaptable to various types of first gas permeable membranes 2 with various gas permeable areas, it can be processed easily into various valve shapes, and the setting of the pressure difference (between the interior and the exterior of the housing 51) at which the valve opens is easy. Moreover, when the one-way valve 5 is made of an elastic material, the one-way valve 5 can be kept closed without applying any force thereto when there is little pressure difference between the interior and the exterior of the housing 51 (when in the steady state condition), and therefore, it becomes easier to prevent the entry of water vapor into the housing 51 when in the steady state condition. Examples of the elastic material include rubber, elastomer, and thermoplastic resin.

The one-way valve 5 does not necessarily have a structure that can completely block the movement of the gas from the exterior to the interior of the housing 51 as long as it has a structure that can block the movement substantially.

Figure 3:
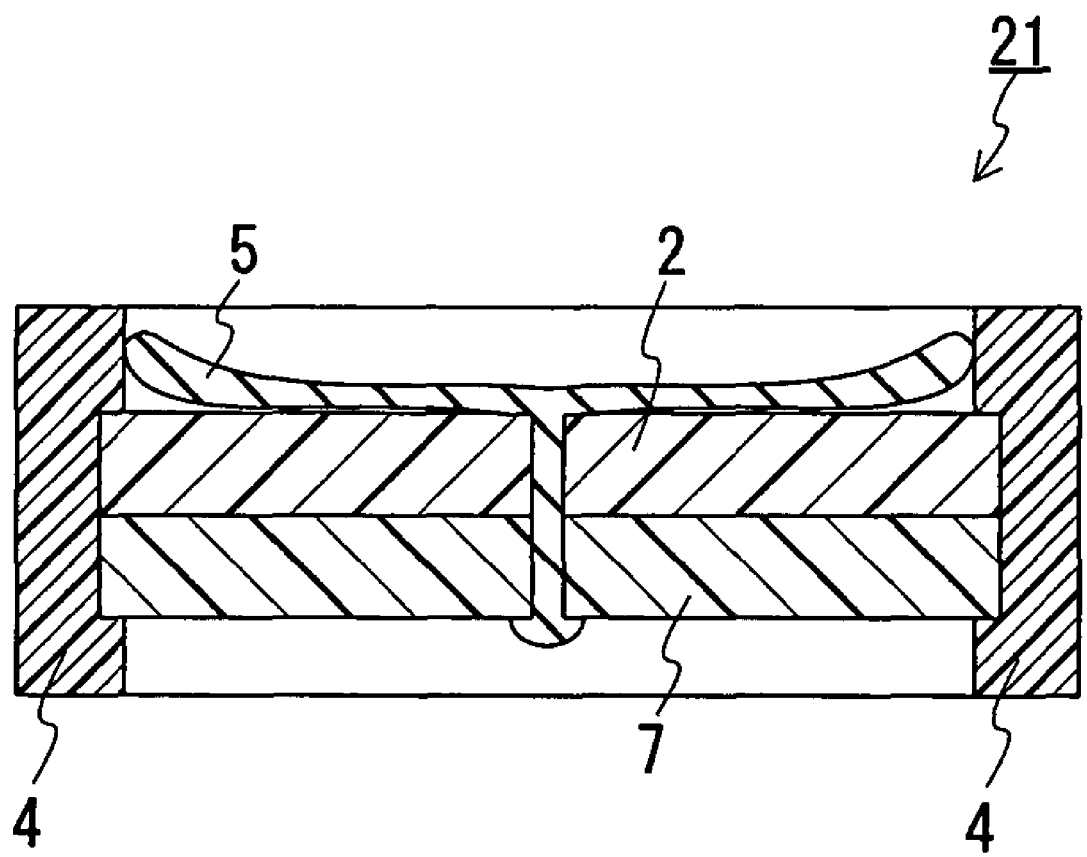
FIG. 3 is a cross-sectional view schematically illustrating one example of the structure of the ventilation member according to the present invention.

The specific shape of the one-way valve 5 is not particularly limited. As illustrated in FIG. 3, the one-way valve 5 may be fixed to the first gas permeable membrane 2 and a later-described reinforcing layer 7. Such a one-way valve 5 may be formed by a resin film or a metal film easily.

The one-way valve 5 shown in FIG. 3 is supported by the first gas permeable membrane 2 and the reinforcing layer 7. The one-way valve 5 may be supported by any optional member as long as the one-way valve 5 is disposed so as to cover the first gas permeable membrane 2. It should be noted that only the first ventilation member 21, which is provided with the one-way valve 5, is depicted in FIG. 3 for clarity in illustration, and likewise, only the first or the second ventilation member may be depicted also in the figures that will be referred to later.

The numbers of the layers of the first gas permeable membrane 2 and the one-way valve 5, as well as the positional relationship between the first gas permeable membrane 2 and the one-way valve 5, in the ventilation member 1 (in the gas passage of the first ventilation member 21) may be determined as desired. When the one-way valve 5 is disposed more outward than the first gas permeable membrane 2 as shown in FIG. 1, the one-way valve 5 also may serve as a protective cover for protecting the first gas permeable membrane 2.

Figure 4A:
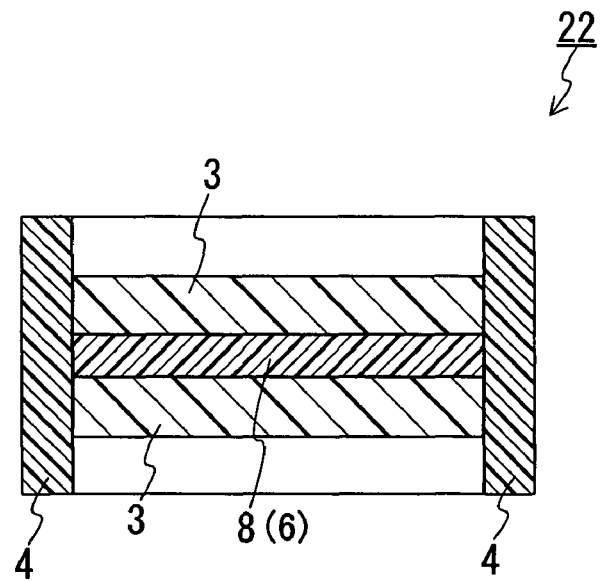
FIG. 4A is a cross-sectional view schematically illustrating one example of the structure of the ventilation member according to the present invention.
Figure 4B:
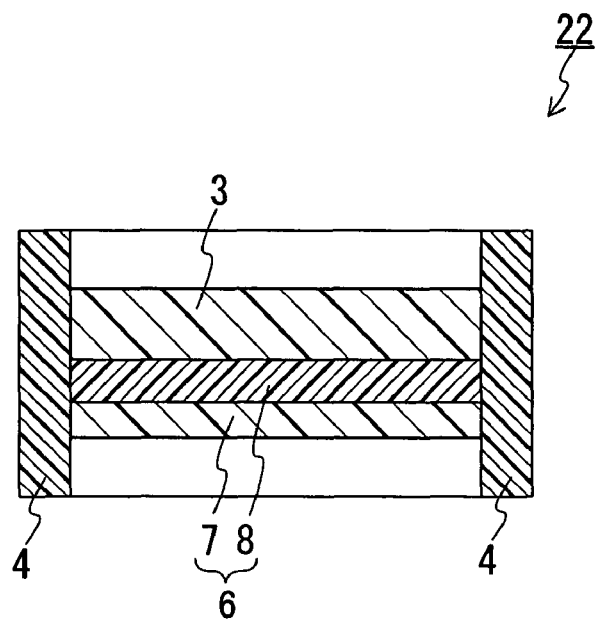
FIG. 4B is a cross-sectional view schematically illustrating one example of the structure of the ventilation member according to the present invention.

The absorbing layer 6 shown in FIG. 1A has a structure in which a water absorbent 8 is sandwiched by a pair of reinforcing layers 7. However, the structure of the absorbing layer 6 is not limited to the example shown in FIG. 1A but should retain the water absorbent 8 in the gas passage of the second ventilation member 22. For example, as illustrated in FIG. 4A, the water absorbent 8 may be sandwiched by a pair of second gas permeable membranes 3. In this case, the water absorbent 8 serves as the absorbing layer 6. As illustrated in FIG. 4B, the water absorbent 8 may be sandwiched by the second gas permeable membrane 3 and the reinforcing layer 7. When the water absorbent 8 itself has a shape that can be supported by the support body 4 (for example, when the water absorbent 8 is in a porous film form), the water absorbent 8 may be disposed by itself in the gas passage of the second ventilation member 22.

The absorbing layer 6 may contain a binder resin that serves as the base material for retaining the shape of the absorbing layer 6. In this case, the absorbing layer 6 may be disposed by itself in the gas passage of the second ventilation member 22. Preferable binder resins include fluororesin and polyolefin, and an example of the fluororesin is polytetrafluoroethylene (PTFE). When the PTFE is used as the binder resin, it is possible to form an absorbing layer 6 that uses a porous material of PTFE as the base material and in which the water absorbent 8 is placed in the pores of the PTFE porous material, depending on the formation method of the absorbing layer 6. In this case, the absorbing layer 6 also can serve as the second gas permeable membrane 3 by controlling the porosity and/or average pore diameter of the PTFE porous material (i.e., the second gas permeable membrane 3 and the absorbing layer 6 can be integrated with each other).

The weight ratio of the water absorbent 8 to the binder resin contained in the absorbing layer 6 normally may be within the range of from 95:5 to 20:80, and preferably within the range of from 90:10 to 25:75. If the content of the binder resin is too small, the binder resin is difficult to become a base material, whereas if the content thereof is too large, the water absorption performance of the absorbing layer 6 degrades. Normally, the thickness of the absorbing layer 6 containing the binder resin should be within the range of from 0.05 mm to 50 mm, and preferably within the range of from 0.5 mm to 5 mm.

Figure 5:
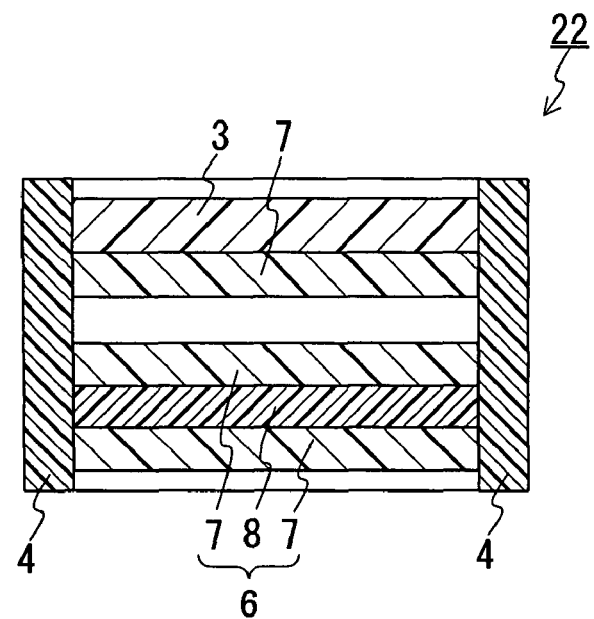
FIG. 5 is a cross-sectional view schematically illustrating one example of the structure of the ventilation member according to the present invention.

As illustrated in FIG. 5, a gap may exist between the second gas permeable membrane 3 and the absorbing layer 6, but when the second gas permeable membrane 3 and the absorbing layer 6 are in contact with each other as shown in FIG. 1, the absorbing layer 6 also can serve as a reinforcing layer for the second gas permeable membrane 3.

Figure 6:
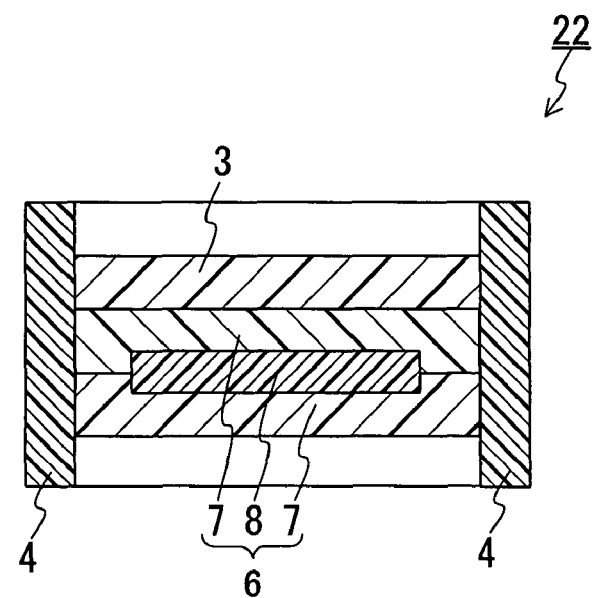
FIG. 6 is a cross-sectional view schematically illustrating one example of the structure of the ventilation member according to the present invention.

Although the water absorbent 8 is disposed in the entire gas permeable part (the entire gas permeable area) of the absorbing layer 6 in the absorbing layer 6 shown in FIG. 1, the water absorbent 8 may be disposed in at least a portion of the gas permeable part the absorbing layer 6, as illustrated in FIG. 6. In order to reduce the amount of moisture in the gas introduced into the interior of the housing 51 more reliably, it is preferable that the water absorbent 8 be disposed in the entire gas permeable part of the absorbing layer 6.

The numbers of the layers of the second gas permeable membrane 3 and the absorbing layer 6 as well as the positional relationship between the second gas permeable membrane 3 and the absorbing layer 6 in the ventilation member 1 (in the gas passage of the second ventilation member 22) may be determined as desired.

The water absorbent 8 may be a common water-absorbent, an adsorbent, and/or a drying agent. Specifically, the water absorbent 8 may be at least one material selected from a material that adsorbs moisture physically (physical adsorbent) and a material that reacts with moisture chemically (chemical absorbent). When using both of the materials, the two materials may be disposed so as to be mixed together in the absorbing layer 6 or the materials may be disposed separately. In addition, when using both of the materials, the weight ratio of the physical adsorbent to the chemical absorbent contained in the water absorbent 8 is within the range of from 1:100 to 1:5, and preferably within the range of from 1:20 to 1:7.

The water absorbent 8 may such an absorbent that absorbs corrosive substances (such as $SO_x$, $NO_x$, and HCl) in the atmosphere. In this case, the amounts of the corrosive substances that are introduced into the housing 51 can be reduced.

The material that adsorbs moisture physically may include at least one material selected from silica such as silica gel, activated carbon, zeolite, alumina, boria, titanium oxide, sepiolite, and activated clay. The zeolite includes a molecular sieve, which is an artificial zeolite.

The material that chemically reacts with moisture may include at least one substance selected from the group consisting of alkali metal oxides, alkaline-earth metal oxides, metal sulfates, metal halides, and metallic perchlorate salts. Examples of the alkali metal oxides include $Na_2O$ and $K_2O$. Examples of the alkaline-earth metal oxides include CaO, MgO, SrO, and BaO. Examples of the metal sulfates include $CaSO_4$, $MgSO_4$, $FeSO_4$, and $NiSO_4$. Examples of the metal halides include $CaCl_2$, $MgCl_2$, $CrCl_2$, $FeCl_2$, and $NiCl_2$. Examples of the metallic perchlorate salts include $KClO_4$, $NaClO_4$, $Fe(ClO_4)_2$, $Co(ClO_4)_2$, $Ca(ClO_4)_2$, $Mg(ClO_4)_2$, $Ba(ClO_4)_2$, $Mn(ClO_2)_2$. Among them, BaO, SrO, CaO, and $CaSO_4$ are preferable because of their large hygroscopic rates.

When the material that physically adsorbs moisture is used as the water absorbent 8, it is easy to remove the moisture from the water absorbent 8 by heat drying or the like (that is, it is easy to recycle and reuse it as the water absorbent 8).

A material that changes its color by absorbing moisture may be added to the water absorbent 8. In this case, it is possible to confirm the lifetime of the absorbing layer 6 (the lifetime of the ventilation member 1) or the replacement timing of the absorbing layer 6 (the replacement timing of the ventilation member 1) by judging the degree of change in the color of the material. The just-mentioned material may include silica gel containing a cobalt salt, for example.

The gas permeability of the first gas permeable membrane 2 with a pressure difference of 10 kPa being applied may be, but is not particularly limited to be, within the range of from 50 to 200,000 $cm^3/min \cdot cm^2$, and preferably within the range of 100 to 100,000 $cm^3/min \cdot cm^2$, from the viewpoint of removing the fogging in the housing 51 more quickly and preventing an excessive pressure increase in the housing 51. The term "gas permeability with a pressure difference of 10 kPa being applied" means the volume of a gas that passes through a gas permeable membrane per unit time and per unit area of the gas permeable membrane when a pressure difference of 10 kPa is produced between the two sides of the gas permeable membrane. Such a gas permeability may be measured using the Frazier air permeability testing method according to JIS L 1096 (1999) or the Gurley densometer testing method according to JIS P 8117. The meaning and the testing methods of the later-described "gas permeability with a pressure difference of 1 kPa being applied" are likewise.

The gas permeable area of the first gas permeable membrane 2 may be, but is not particularly limited to be, within the range of from 5 to 5,000 mm$^2$, and preferably within the range of from 30 to 3,000 mm$^2$, from the viewpoint of removing the fogging in the housing 51 more quickly and preventing an excessive pressure increase in the housing 51.

Although the gas permeability of the second gas permeable membrane 3 is not particularly limited, the gas permeability thereof with a pressure difference of 1 kPa being applied may be within the range of from 0.05 to 100 cm$^3$/min·cm$^2$, and preferably within the range of 0.1 to 50 cm$^3$/min·cm$^2$, from the viewpoint of extending the time until fogging will be produced in the housing 51.

The gas permeable area of the second gas permeable membrane 3 may be, but is not particularly limited to be, within the range of from 1 to 2,000 mm$^2$, and preferably within the range of from 5 to 1,000 mm$^2$, from the viewpoint of further extending the time until fogging will be produced in the housing 51.

The ratio of the gas permeable area of the first gas permeable membrane 2 and the gas permeable area of the second gas permeable membrane 3 may be set as appropriate depending on the characteristics required as the ventilation member 1. For example, the ratio of (the gas permeable area of the first gas permeable membrane 2)/(the gas permeable area of the second gas permeable membrane 3) may be within the range of from about 0.01 to 1000, and preferably within the range of from about 0.05 to 500.

The material and structure of the first and second gas permeable membranes are not particularly limited as long as a necessary gas permeation quantity can be ensured. For example, it is possible to employ a gas permeable membrane containing fabric, nonwoven fabric, net, porous material, or foamed material. Especially, a gas permeable membrane containing a porous material of fluororesin and/or a porous material of polyolefin is preferable from the viewpoints of water repellency (waterproofness), heat resistance, chemical resistance, and the like. Examples of the fluororesin that may be used include polytetrafluoroethylene (PTFE), polychloro-trifluoroethylene, tetrafluoroethylene-hexafluoropropylene copolymer, tetrafluoroethylene-perfluoroalkylvinyl copolymer, tetrafluoroethylene-ethylene copolymer, and polyvinylidene fluoride (PVdF). It is especially preferable to use a PTFE porous material, which is capable of ensuring sufficient ventilation performance with a small gas permeable area and preventing the entry of foreign matter such as water and dust into the housing 51 highly effectively. Examples of the polyolefin that may be used include polyethylene, polypropylene, and ultrahigh-molecular-weight polyethylene.

When a porous material of fluororesin and/or a porous material of polyolefin resin is/are used for at least one gas permeable membrane selected from the first gas permeable membrane and the second gas permeable membrane, it is preferable that the average pore diameter of the porous material be within the range of from about 0.01 pm to 50 µm from the viewpoint of waterproofness. Such a porous material can be obtained by a common method for forming porous materials, such as a drawing method and an extraction method.

The number of layers of each of the first gas permeable membrane 2 and the second gas permeable membrane 3 provided for the ventilation member 1 according to the present invention is not limited to one layer, and it may be set as desired.

In the ventilation member 1 shown in FIG. 1, the reinforcing layer 7 is laminated with the first gas permeable membrane 2. In addition, the absorbing layer 6 containing the reinforcing layers 7 is disposed so as to be in contact with the second gas permeable membrane 3, and the absorbing layer 6 also serves as a reinforcing layer for the second gas permeable membrane 3. In this way, a reinforcing layer 7 may be laminated with at least one gas permeable membrane selected from the first gas permeable membrane 2 and the second gas permeable membrane 3, and the strength of the gas permeable membrane with which a reinforcing layer 7 is laminated can be improved. The number of layers of the reinforcing layer 7 laminated with the gas permeable membrane may be set as desired.

The material and the structure of the reinforcing layer 7 are not particularly limited, but it is preferable that the reinforcing layer have better gas permeability than the gas permeable membrane. Examples of the reinforcing layer 7 that may be used include fabric, nonwoven fabric, mesh, net, sponge, foam, and porous material, which may be made of, for example, a resin or a metal.

The reinforcing layer 7 may be joined to the gas permeable membrane. The joining may be performed by such techniques as adhesive lamination, heat lamination, heat bonding, and ultrasonic welding.

It is possible that at least one of the gas permeable membrane selected from the first and the second gas permeable membranes may be a liquid repellent (e.g. water repellent or oil repellent) membrane. The liquid repellency of the membrane can be achieved by a liquid repellent treatment for the membrane, and the treatment may be conducted by, for example, applying a substance having a small surface tension to the gas permeable membrane, then drying and thereafter curing it. Examples of the liquid repellent that may be used for the liquid repellent treatment include a solution containing a polymer material having perfluoroalkyl groups. The application of the liquid repellent to a gas permeable membrane may be conducted by a common technique, such as an impregnation method or a spraying method. When the gas permeable membrane is liquid repellent treated, it is possible to prevent the gas permeable membrane from being plugged up because of the oil or the surfactant in the environment in which the ventilation member 1 is placed. In other words, the liquid repellent treatment is especially effective when the ventilation member 1 is used outdoors (for example, when used for a housing for ECUs or automobile lamps).

It is preferable to use a thermoplastic resin as the material for the support body 4 from the viewpoint of moldability. Examples that may be used include various thermoplastic elastomers such as olefin-based, styrene-based, urethane-based, ester-based, amide-based, and vinyl chloride-based thermoplastic elastomers; various thermoplastic resins such as polyolefin, polyamide, polyester, polyacetal, polysulfone, polyacrylic, and polyphenylene sulfide; and composite materials thereof.

The various members that are supported by the support body 4 may be fixed to the support body 4 by using such techniques as heat-bonding, ultrasonic welding, and adhesive bonding. Especially, heat-bonding and ultrasonic welding techniques are simple and therefore preferable. When the first gas permeable membrane 2 is fixed to the support body 4, damages to the first gas permeable membrane 2 can be minimized when the reinforcing layer 7 and the first gas permeable membrane 2 are laminated together and thereafter fixed to the support body 4. Likewise, when the second gas permeable membrane 3 is fixed to the support body 4, damages to the second gas permeable membrane 3 can be minimized when the second gas permeable membrane 3 is laminated with the reinforcing layer 7 and/or the absorbing layer 6 and thereafter fixed to the support body 4.

The shape of the support body 4 is not particularly limited as long as the purpose of the ventilation member 1 is met. The support body 4 may be formed using common molding techniques, such as injection molding and extrusion molding.

The first support body 41 and the second the support body 42 in the ventilation member kit 23 may be similar to the support body 4.

Figure 7:
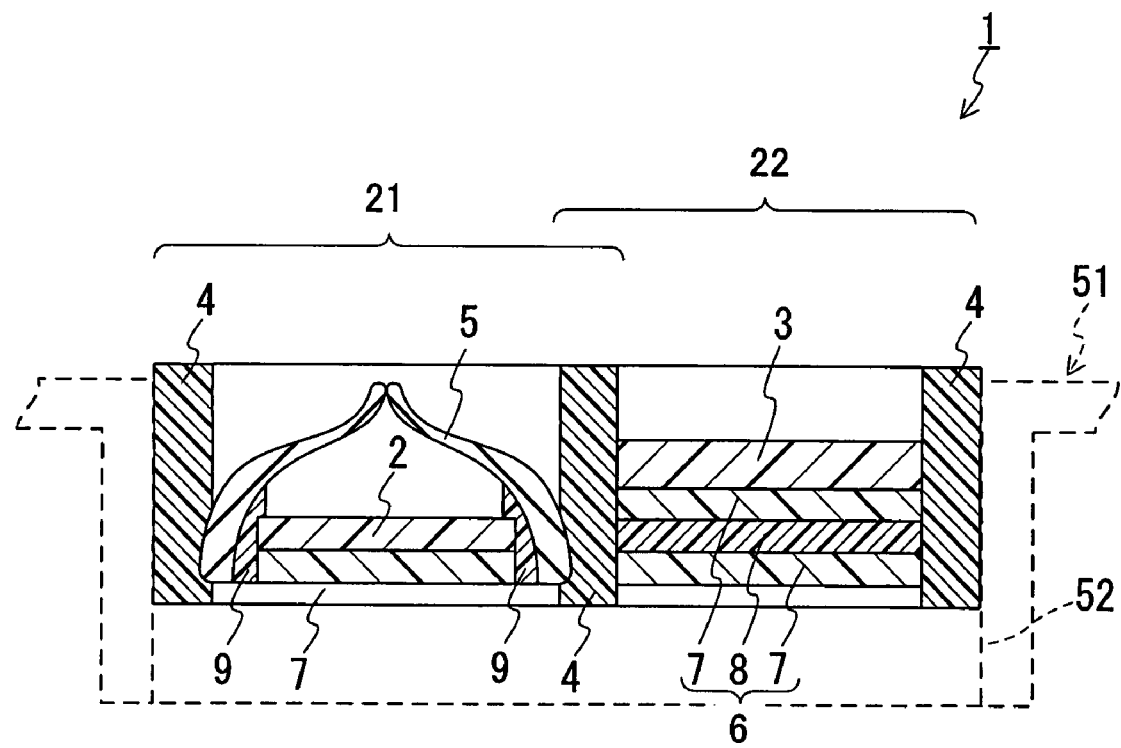
FIG. 7 is a cross-sectional view schematically illustrating another example of the ventilation member according to the present invention.

In the ventilation member 1 shown in FIG. 1, each of the first gas permeable membrane 2, the second gas permeable membrane 3, and the absorbing layer 6 is supported directly by the support body 4; however, it is possible to dispose another member between each of the just-mentioned members and the support body 4. In this case, each of the just-mentioned members is supported by the support body 4 via the member that is disposed therebetween. For example, in the ventilation member 1 shown in FIG. 7, the first gas permeable membrane 2 is supported by the support body 4 via the one-way valve 5 and a support layer 9. The material used for the support layer 9 may be similar to the material used for the support body 4, and the shape and structure thereof are not particularly limited.

Figure 8A:
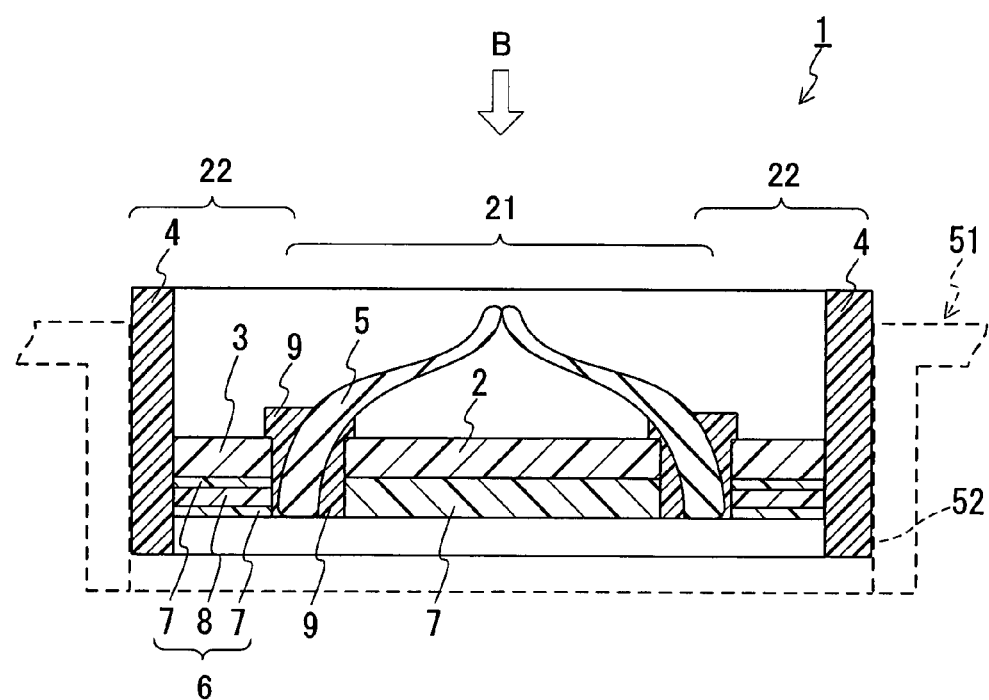
FIG. 8A is a cross-sectional view schematically illustrating still another example of the ventilation member according to the present invention.
Figure 8B:
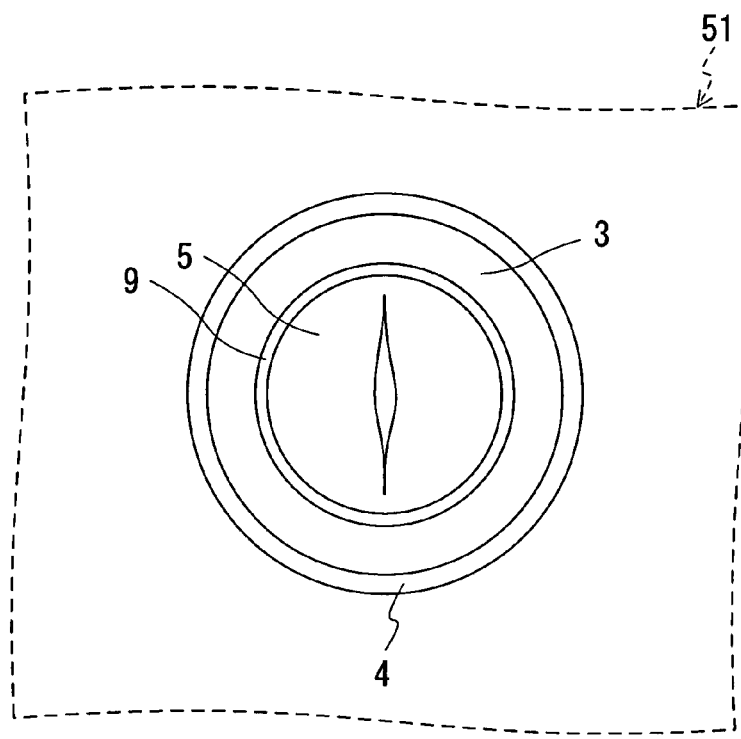
FIG. 8B is a schematic view of the ventilation member shown in FIG. 8A, viewed from the top.

In the ventilation member 1 of the present invention, the specific configuration for integrating the first ventilation member 21 and the second ventilation member 22 together is not particularly limited. For example, a ventilation member 1 having the configuration shown in FIGS. 8A and 8B may be employed. In the ventilation member 1 shown in FIGS. 8A and 8B, a second gas permeable membrane 3 and an adsorbing layer 6, which are in a doughnut-like shape, are fixed in a substantially tubular support body 4. A one-way valve 5 and a laminated body of a first gas permeable membrane 2 and a reinforcing layer 7 are fixed on the inner sides of the second gas permeable membrane 3 and the adsorbing layer 6 via a support layer 9. In other words, the ventilation member 1 shown in FIGS. 8A and 8B may be a ventilation member in which the second ventilation member 22 having the absorbing layer 6 is disposed in an outer circumferential part thereof and the first ventilation member 21 having the one-way valve 5 is disposed in an inner circumferential part thereof. It should be noted that FIG. 8B is a view in which the ventilation member 1 shown in FIG. 8A is viewed from the upper face (in other words, viewed in the direction along the arrow B in FIG. 8A).

Figure 9:
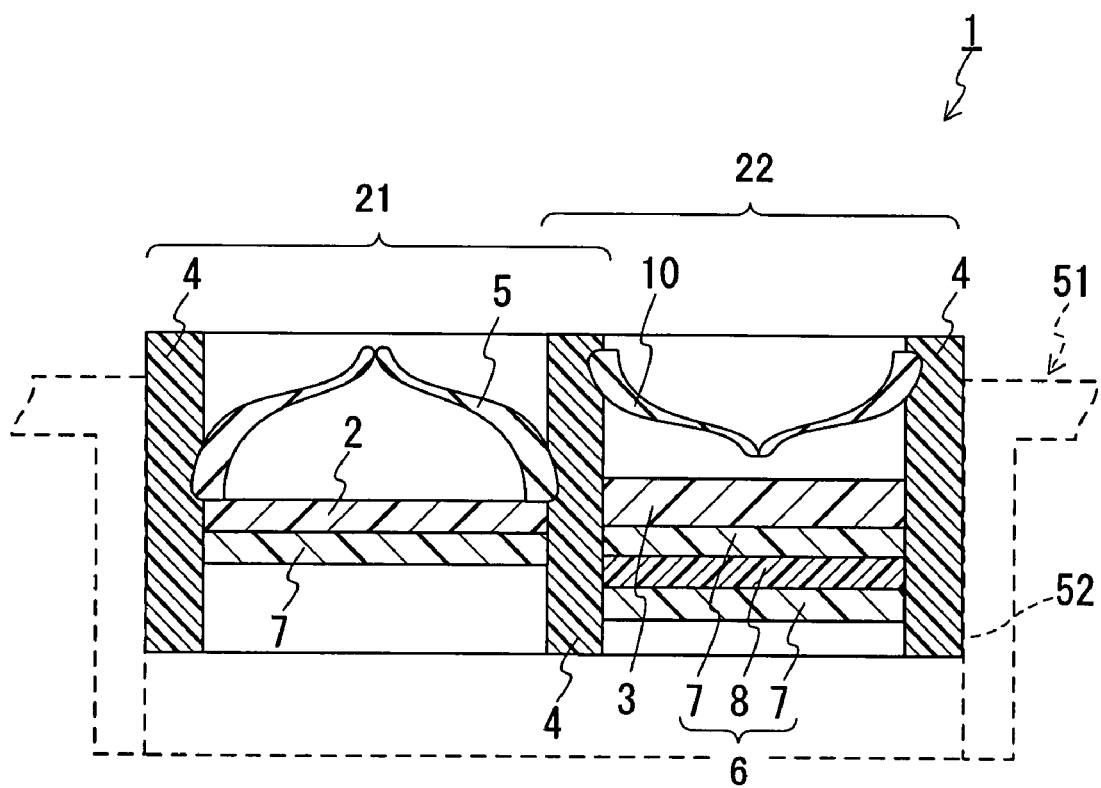
FIG. 9 is a cross-sectional view schematically illustrating yet another example of the ventilation member according to the present invention.

The ventilation member of the present invention further may have a second one-way valve disposed so as to cover the second gas permeable membrane. FIG. 9 illustrates one example of the ventilation member 1 that has such a configuration.

The ventilation member 1 shown in FIG. 9 further has a second one-way valve 10 supported by the support body 4 so as to cover the second gas permeable membrane 3. The gas flow direction of the second one-way valve 10 is the direction in which a gas passes from the exterior toward the interior of the housing 51 with the ventilation member 1 being fixed to the opening 52 of the housing 51 (i.e., the gas flow direction of the second one-way valve 10 and the gas flow direction of the first one-way valve 5 are opposite to each other). In addition, the second one-way valve 10 is disposed nearer to the external environment than the absorbing layer 6, which is located at an innermost position in the ventilation member 1 (i.e., in the gas passage of the second ventilation member 22) toward the housing 51.

This configuration makes it possible to prevent the entry of water vapor into the absorbing layer 6 from the external environment and to extend the lifetime and replacement cycle of the absorbing layer 6 because the second one-way valve 10 can be closed when in the steady state condition.

The material used for the second one-way valve 10 as well as the specific shape and structure of the second one-way valve 10 may be similar to those of the first one-way valve 5. When the one-way valve 10 is made of an elastic material, the one-way valve 10 can be kept closed without applying any force thereto when in the steady state condition, and therefore, it becomes easier to prevent the entry of water vapor into the absorbing layer 6.

The number of the second one-way valve 10 as well as the positional relationship between the second one-way valve 10 and the second gas permeable membrane 3 and/or the absorbing layer 6 in the ventilation member 1 (in the gas passage of the second ventilation member 22) may be determined as desired. When the second one-way valve 10 is disposed nearer to the external environment than the second gas permeable membrane 3 as shown in FIG. 9, the second one-way valve 10 also may serve as a protective cover for protecting the first gas permeable membrane 2.

Figure 10:
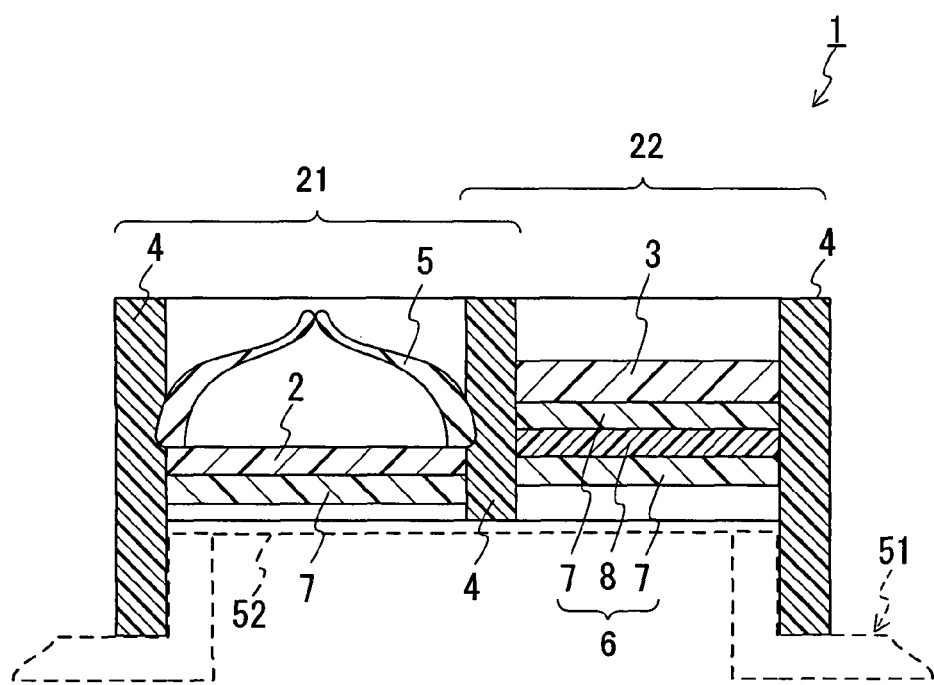
FIG. 10 is a schematic cross-sectional view for illustrating one example of how to fix the ventilation member, according to the present invention, to a housing.
Figure 11:
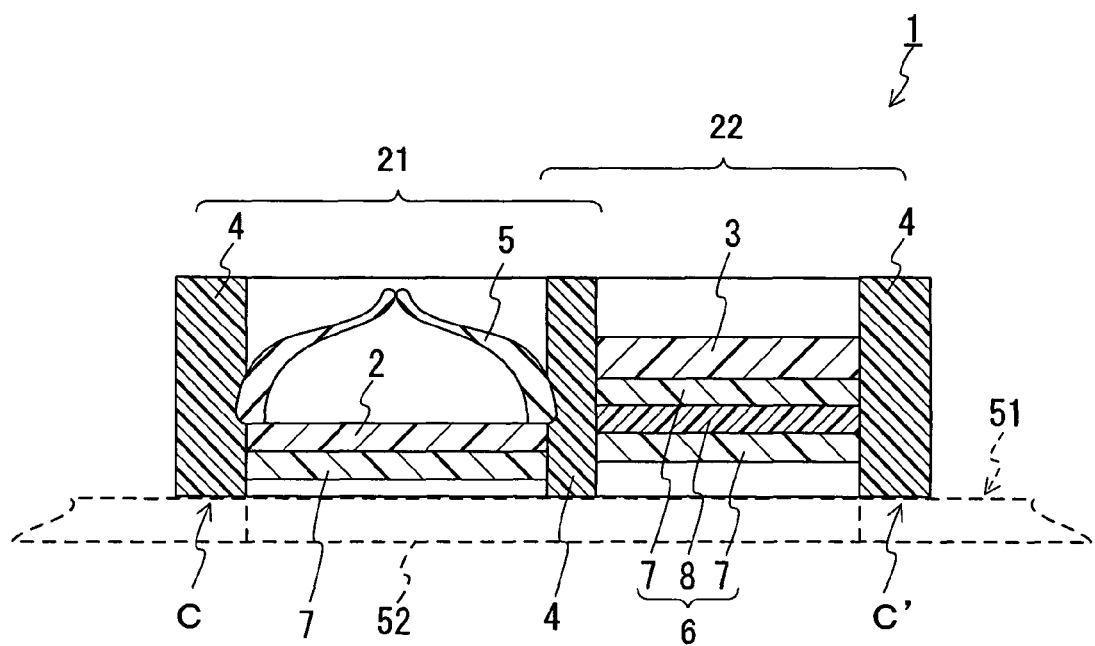
FIG. 11 is a schematic cross-sectional view for illustrating another example of how to fix the ventilation member, according to the present invention, to the housing.

The method for fixing the ventilation member 1 to the opening 52 of the housing 51 is not particularly limited, and common fixing methods may be employed. As illustrated in FIG. 1A, the ventilation member 1 may be fixed by inserting it into the opening 52, or as illustrated in FIG. 10, the ventilation member 1 may be fixed so as to cover the opening 52. When the ventilation member 1 is fixed by inserting it into the opening 52, it is preferable that the outer diameter of the support body 4 be slightly larger than the inner diameter of the opening 52. When the ventilation member 1 is fixed so as to cover the opening 52, it is preferable that the inner diameter of the support body 4 be slightly smaller than the outer diameter of the opening 52. As shown in FIG. 11, it is also possible to fix the ventilation member 1 and the housing 51 together by adhesive bonding. In the example shown in FIG. 11, bottom faces (denoted as C and C' in FIG. 11) of the ventilation member 1 and a surface of the housing 51 are adhesive-bonded together so as to cover the opening 52 of the housing 51. Alternatively, a male screw may be formed on the outer circumferential surface of the support body 4 of the ventilation member 1 and a female screw may be formed in the opening 52 of the housing 51 so that the support body 4 and the opening 52 can be screw-fastened together to fix the ventilation member 1. It is also possible to fix the ventilation member 1 by simply fitting the ventilation member 1 and the opening 52 together.

Figure 12:
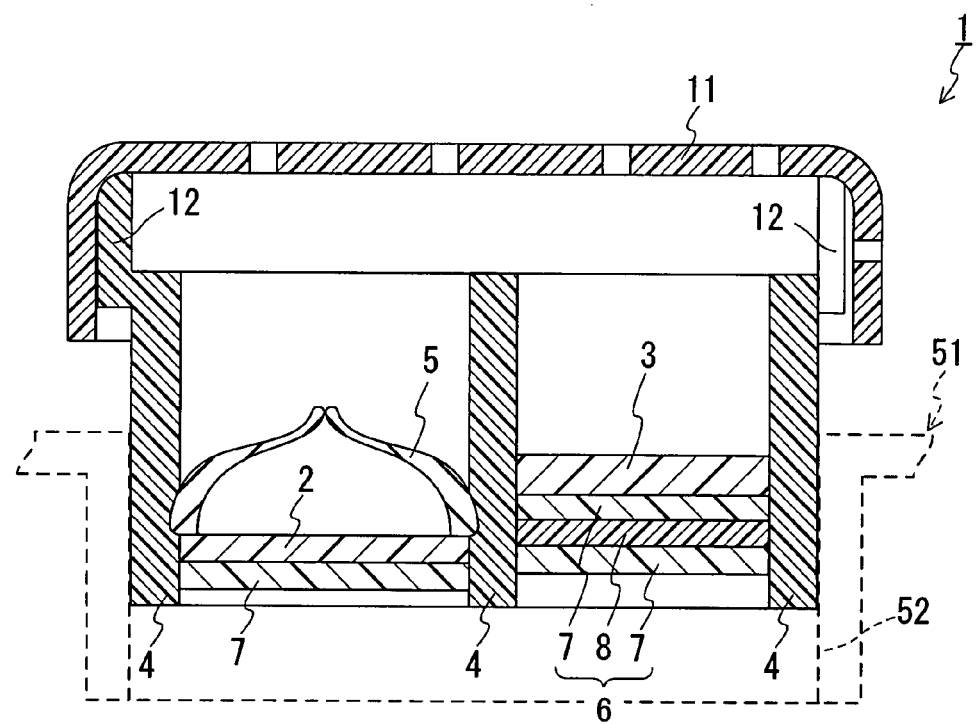
FIG. 12 is a cross-sectional view schematically illustrating still another example, different from the foregoing examples, of the ventilation member according to the present invention.

Another example of the ventilation member 1 according to the present invention is illustrated in FIG. 12. The ventilation member 1 shown in FIG. 12 further has a closed-bottomed protective cover 11 that covers the first gas permeable membrane 2 and the second gas permeable membrane 3. The protective cover 11 is supported by the support body 4 in such a manner that a space gap can exist between the gas permeable membranes and the protective cover 11 to ensure a gas passage from the external environment to the gas permeable membranes. Such ventilation member can prevent breakage or the like of the gas permeable membrane because the protective cover 11 hinders foreign matters from the exterior, such as stone chips, dust, and water, from making contact with the gas permeable membranes.

The shape of the protective cover 11 and the method for supporting the protective cover 11 by the support body 4 are not particularly limited. In the ventilation member 1 shown in FIG. 12, a protrusion portion 12 that is formed on the support body 4 supports the protective cover and ensures the gas passage.

As already mentioned above, the ventilation member according to the present invention may also be used not only in the configuration in which the first ventilation member 21 and the second ventilation member 22 are integrated with each other, as shown in, for example, FIGS. 1A (1B), 8A (8B) and 9, but also as the ventilation member kit 23 having the first ventilation member 21 and the second ventilation member 22, as shown in FIG. 2. In this case, the first and the second ventilation members may be fabricated or sold independently as separate ventilation members before they will be fixed to the first and the second openings of the housing.

The first and the second ventilation members in the ventilation member kit 23 will be described.

Figure 13:
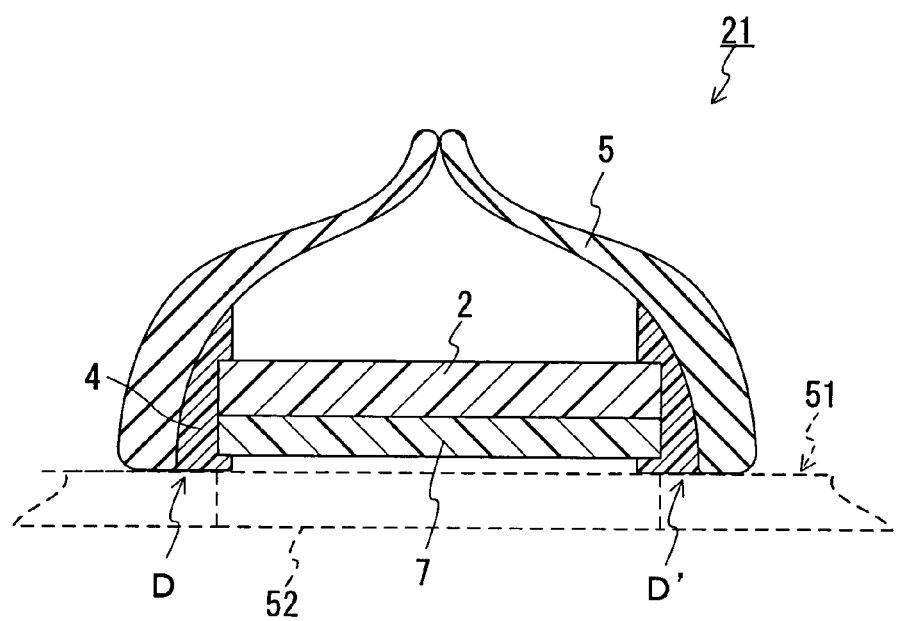
FIG. 13 is a cross-sectional view schematically illustrating yet another example, different from the foregoing examples, of the ventilation member according to the present invention.

A first ventilation member 21 shown in FIG. 13 is provided with a first gas permeable membrane 2 and a support body 4 for supporting the first gas permeable membrane. The support body 4 is fixed so as to cover the opening 52 of the housing 51 at bottom faces (denoted as D and D' in FIG. 12) of the first ventilation member 21 by adhesive bonding. The first ventilation member 21 further has a first one-way valve (check valve) 5 supported by the support body 4 so as to cover the first gas permeable membrane 2. The gas flow direction of the first one-way valve 5 is the direction in which a gas passes from the interior toward the exterior of the housing 51 with the first ventilation member 21 being fixed to the opening 52 of the housing 51.

When the interior of the housing 51 becomes a pressurized condition relative to the external environment, the gas tends to move from the interior toward the exterior of the housing 51. At this point, the one-way valve 5 of the first ventilation member 21 opens up, so the gas is allowed to permeate through the first gas permeable membrane 2 and is discharged quickly to the exterior of the housing 51. As a result, even when fogging has been developed in the housing 51, the fogging can be cleared quickly. Moreover, it is possible to prevent an excessive pressure increase in the housing 51.

The specific structure and configuration of the first ventilation member 21 may be similar to those of the previously-described first ventilation member 21 in the ventilation member 1 according to the present invention. The method for fixing the first ventilation member 21 to the housing 51 may be similar to the previously-described fixing method of the ventilation member 1 to the housing 51.

Figure 14:
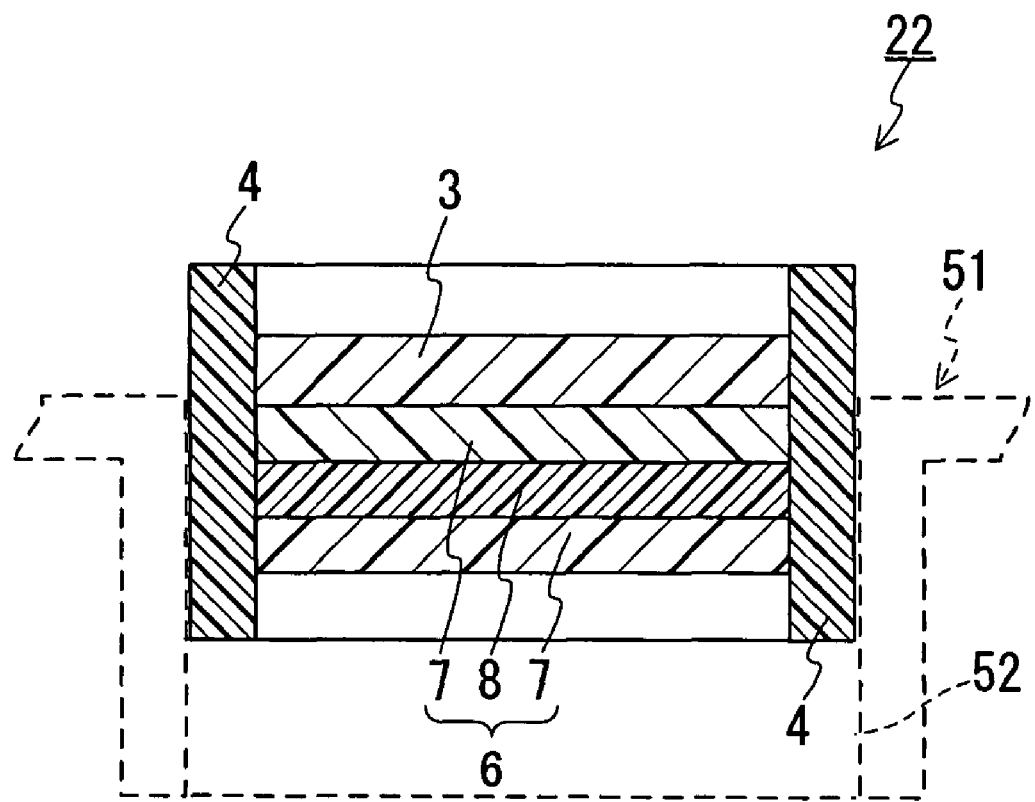
FIG. 14 is a cross-sectional view schematically illustrating further another example, different from the foregoing examples, of the ventilation member according to the present invention.

A second ventilation member 22 shown in FIG. 14 is provided with a second gas permeable membrane 3 and a support body 4 for supporting the second gas permeable membrane. The support body 4 is inserted in and fixed to an opening 52 of a housing 51. The second ventilation member 22 further has an absorbing layer 6 containing a water absorbent for absorbing the moisture contained in the gas that passes through the opening 52. Here, the absorbing layer 6 and the second gas permeable membrane 3 are disposed so that the above-mentioned gas permeates through the second gas permeable membrane 3 and the absorbing layer 6 successively (in whichever order). It can be said that the second gas permeable membrane 3 and the absorbing layer 6 are disposed on the gas passage of the second ventilation member 22.

When the interior of the housing 51 becomes a negative pressure condition relative to the external environment, the gas tends to move from the exterior toward the interior of the housing 51, and the gas is led to permeate through the second gas permeable membrane 3 and the absorbing layer 6 and is introduced into the interior of the housing 51. At this time, the gas in which the amount of moisture is reduced by the absorbing layer 6 is introduced into the interior of the housing 51, and therefore, the time until fogging will be produced in the housing 51 can be extended. It is also possible to prevent the production of fogging in the housing 51 itself by optimizing the type and amount of the water absorbent contained in the absorbing layer 6.

The specific structure and configuration of the second ventilation member 22 may be similar to those of the previously-described second ventilation member 22 in the ventilation member 1 according to the present invention. The method for fixing the second ventilation member 22 to the housing 51 may be similar to the previously-described fixing method of the ventilation member 1 to the housing 51.

The ventilation member 1, the first ventilation member 21, and the second ventilation member 22 of the present invention may be provided with optional components other than the above-described components as needed.

When the ventilation member 1 according to the present invention is fixed to an opening of a tank, the following advantageous effects can be obtained.

When the interior of the tank becomes a negative pressure condition relative to the external environment, the gas tends to move from the exterior toward the interior of the tank. However, the one-way valve 5 closes up at this point, so the gas is led to permeate through the second gas permeable membrane 3 and the absorbing layer 6 and is introduced into the interior of the tank. At this time, the gas in which the amount of moisture is reduced by the absorbing layer 6 is introduced into the interior of the tank, and therefore, the amount of water vapor that enters the interior of the tank can be reduced. It is also possible to prevent the entry of water vapor into the tank by optimizing the type and amount of the water absorbent contained in the absorbing layer 6.

Conversely, when the interior of the tank becomes a pressurized condition relative to the external environment, the gas tends to move from the interior toward the exterior of the tank. At this point, the one-way valve 5 opens up, so the gas is allowed to permeate through the first gas permeable membrane 2 and the second gas permeable membrane 3 and is discharged to the exterior of the tank. In other words, the gas in the tank can be discharged quickly to the exterior of the tank. Moreover, it is possible to prevent an excessive pressure increase in the tank.

Next, the following describes a vented housing and a vented tank according to the present invention.

A vented housing according to the present invention has a structure in which a ventilation member 1 and/or a ventilation member kit 23 according to the present invention is/are fixed to an opening of the housing. As a result, it is possible to provide a vented housing that can ensure a long time until fogging will be produced in the housing and can clear the fogging up quickly even when fogging has been produced. It should be noted that the gas flow direction of the one-way valve 5 provided in the ventilation member 1 (or the ventilation member kit 23) needs to be the direction in which the gas passes from the interior to the exterior of the housing.

The type of the vented housing in which a ventilation member according to the present invention may be fixed is not particularly limited. Examples include electrical components such as headlamps, tail lamps, fog lamps, turn indicator lamps, reversing lamps, motor housings, pressure sensors, pressure switches, ECUs, batteries, and electric double layer capacitors, as well as electric products in which electronic devices and electronic circuits are accommodated, such as mobile telephones, cameras, electric shavers, electric toothbrushes, and lamps. In particular, the advantageous effects obtained are significant when the vented housing is an automobile electrical component, such as an automobile lamp.

A vented tank according to the present invention has a structure in which a ventilation member 1 and/or a ventilation member kit 23 according to the present invention is/are fixed to an opening of the tank. As a result, it is possible to provide a vented tank that can reduce the amount of water vapor that enters the interior of the tank and can discharge the gas in the tank quickly to the exterior of the tank when the pressure inside the tank increases. It should be noted that the gas flow direction of the one-way valve 5 provided in the ventilation member 1 (or the ventilation member kit 23) needs to be the direction in which the gas passes from the interior to the exterior of the tank.

The type of the vented tank to which a ventilation member according to the present invention is fixed is not particularly limited. Examples may include containers for accommodating liquid therein, such as various bottles for chemicals, organic solvent tanks, and gas tanks.

EXAMPLES

Hereinbelow, the present invention will be described in detail with reference to examples. It should be understood, however, that the invention is not limited by the following examples.

In the present examples, five types of the ventilation members that have a structure as shown in FIG. 1 as the example samples and three types of comparative example samples were fabricated to evaluate the fogging characteristic, the fogging clearing characteristic, and the pressure difference eliminating characteristic for each of the ventilation member samples when fixed to an automobile lamp.

First, manufacturing methods for the samples of the ventilation members will be described.

-Sample 1-

First, a support body 4 as shown in FIG. 1 that has two holes (one of the holes, hole A had a diameter of 16 mmΦ, and the other one, hole B had a diameter of 10 mmΦ) for placing gas permeable membranes therein was molded using a thermoplastic elastomer ("Milastomer 6030" made by Mitsui Chemicals, Inc.) by injection molding. Next, a laminated material of a polytetrafluoroethylene (PTFE) porous film and a polyolefin non-woven fabric ("Temish" made by Nitto Denko Corp.: the gas permeability of the film with a pressure difference of 10 kPa being applied was 20,000 $cm^3/min \cdot cm^2$), serving as the laminated material of the reinforcing layer 7 and the first gas permeable membrane 2, was fixed in the hole A of the molded support body 4 by heat-bonding. Next, a one-way valve 5 obtained by molding silicone rubber (made by Shin-Etsu Silicone Co., Ltd.) was fixed further thereto so as to cover the entire surface of the fixed laminated material. The gas permeable area of the laminated material was 100 $mm^2$, and it was confirmed separately that the one-way valve 5 opens when the pressure inside the lamp becomes about 1 kPa higher than that of the external environment.

Next, barium oxide (BaO) powder, serving as the water absorbent 8, was sandwiched between a pair of PTFE porous films ("Temish" made by Nitto Denko Corp.: the gas permeability of the film with a pressure difference of 1 kPa being applied was 20 $cm^3/min \cdot cm^2$), to form a laminated material (gas permeable area 25 $mm^2$), which serves as the second gas permeable membrane 3 and the absorbing layer 6. The laminated material was fixed in the hole B of the support body 4 by a compression method. Thus, a ventilation member 1 (sample 1) shown in FIG. 1 was fabricated. The PTFE porous films were subjected to an oil repellent treatment.

-Sample 2-

First, a support body 4 as shown in FIG. 1 that has two holes for disposing gas permeable membranes therein (both holes having a diameter of 16 mmΦ) was molded by injection molding using a polypropylene resin ("J802H" made by Ube Industries, Ltd.). Next, a laminated material of a PTFE porous film ("Temish" made by Nitto Denko Corp.) and a net made of polyolefin ("Conwed Net ON3330" made by Nisseki Plasto Co., Ltd.), serving as the laminated material of the reinforcing layer 7 and the first gas permeable membrane 2, (formed by heat lamination: the gas permeability of the film with a pressure difference of 10 kPa being applied was 50,400 $cm^3/min \cdot cm^2$) was fixed in one of the holes in the molded support body 4 by heat-bonding. Next, a one-way valve 5 obtained by molding nitrile rubber was fixed further thereto so as to cover the entire surface of the fixed laminated material. The gas permeable area of the laminated material is 78.5 $mm^2$, and it was confirmed separately that the one-way valve 5 opens when the pressure inside the lamp becomes about 1.2 kPa higher than that of the external environment.

Next, a mixture of calcium oxide (CaO) powder and activated carbon, serving as the water absorbent 8, was sandwiched between a pair of polypropylene porous films ("NTG" made by Nitto Denko Corp.: the gas permeability of the film with a pressure difference of 1 kPa being applied was 1.2 $cm^3/min \cdot cm^2$) to form a laminated material (gas permeable area 78.5 $mm^2$), serving as the second gas permeable membrane 3 and the absorbing layer 6. The laminated material was fixed in the other hole of the support body 4 by heat-bonding. Thus, a ventilation member 1 (sample 2) shown in FIG. 1 was fabricated. The weight ratio of the calcium oxide and the activated carbon contained in the water absorbent 8 was 2:8.

-Sample 3-

First, a support body 4 as shown in FIG. 1 that has two holes (one of the holes, hole A had a diameter of 10 mmΦ, and the other one, hole B had a diameter of 30 mmΦ for placing gas permeable membranes therein was molded using an ethylene propylene rubber (EPDM) ("EP21" made by JSR Corp.) by vulcanization molding. Next, an ultrahigh-molecular-weight polyethylene porous film ("Sunmap" made by Nitto Denko Corp.: the gas permeability of the film with a pressure difference of 10 kPa being applied was 106,700 $cm^3/min \cdot cm^2$), serving as the first gas permeable membrane 2, was fixed in the hole A of the molded support body 4 by a rubber adhesive. Next, a one-way valve 5 obtained by molding a polyethylene film was fixed further thereto so as to cover the entire surface of the first gas permeable membrane 2 that has been fixed. The gas permeable area of the laminated material was 19.6 $mm^2$, and it was confirmed separately that the one-way valve 5 opens when the pressure inside the lamp becomes about 0.7 kPa higher than that of the external environment.

Next, potassium oxide ($K_2O$) powder, serving as the water absorbent 8, was sandwiched between a pair of PTFE porous films ("Temish" made by Nitto Denko Corp.: the gas permeability of the film with a pressure difference of 1 kPa being applied was 58 $cm^3/min \cdot cm^2$), to form a laminated material (gas permeable area 380 $mm^2$), and zeolite (made by Asahi Glass Co., Ltd.), serving as the water absorbent 8, likewise was sandwiched between a pair of PTFE porous films, the same as the just-mentioned ones, to form a laminated material (gas permeable area 380 $mm^2$). These laminated materials, which serve as the second gas permeable membrane 3 and the absorbing layer 6, were fixed in the hole B of the support body 4 by a rubber adhesive. Thus, a ventilation member 1 (sample 3) was fabricated. At this time, these laminated materials were fixed in such a manner that the potassium oxide and the zeolite were disposed in that order with respect to the gas flow direction of the one-way valve 5 fixed in the hole A (i.e., the outside air permeates through the potassium oxide after it permeates through the zeolite with the ventilation member being fixed to the housing). It should be noted that the ultrahigh-molecular-weight polyethylene porous film and the PTFE porous film were subjected to an oil repellent treatment using "Unidyne" made by Daikin Industries, Ltd.

-Sample 4-

First, a support body 4 as shown in FIG. 1 that has two holes (one of the holes, hole A had a diameter of 55 mmΦ, and the other one, hole B had a diameter of 8 mmΦ) for placing gas permeable membranes therein was molded using a polyester elastomer ("Hytrel" made by Toray-DuPont Corp.) by injection molding. Next, a laminated material of a PTFE porous film ("Temish" made by Nitto Denko Corp.) and a net made of polyester ("Bellcouple" made by Kanebo Inc.) (the gas permeability of the film with a pressure difference of 10 kPa being applied was 54 $cm^3/min \cdot cm^2$), serving as the laminated material of the reinforcing layer 7 and the first gas permeable membrane 2, was fixed in the hole A of the molded support body 4 by heat-bonding. Next, a one-way valve 5 obtained by molding silicone rubber (made by Shin-Etsu Silicone Co., Ltd.) was fixed further thereto so as to cover the entire surface of the fixed laminated material. The gas permeable area of the laminated material was 1,590 $mm^2$, and it was confirmed separately that the one-way valve 5 opens when the pressure inside the lamp becomes about 1 kPa higher than that of the external environment.

Next, a mixture of magnesium oxide (MgO) powder and calcium chloride ($CaCl_2$) powder, serving as the water absorbent 8, was sandwiched between a pair of polyester porous films (the gas permeability of the film with a pressure difference of 1 kPa being applied was 98 $cm^3/min \cdot cm^2$) to form a laminated material (gas permeable area: 3.1 $mm^2$), serving as the second gas permeable membrane 3 and the absorbing layer 6. The laminated material was fixed in the hole B of the support body 4 by heat-bonding. Thus, a ventilation member 1 (sample 4) shown in FIG. 1 was fabricated. The weight ratio of the magnesium oxide and the calcium chloride contained in the water absorbent 8 was 5:5.

-Sample 5-

First, a support body 4 as shown in FIG. 1 that has two holes (one of the holes, hole A had a diameter of 75 mmΦ, and the other one, hole B had a diameter of 60 mmΦ) for placing gas permeable membranes therein was molded using a thermoplastic elastomer ("Milastomer 6030" made by Mitsui Chemicals, Inc.) by injection molding. Next, an ultrahigh-molecular-weight polyethylene porous film ("Sunmap" made by Nitto Denko Corp.: the gas permeability of the film with a pressure difference of 10 kPa being applied is 218,000 $cm^3/min \cdot cm^2$), serving as the first gas permeable membrane 2, was fixed in the hole A of the molded support body 4 by heat-bonding. Next, a one-way valve 5 obtained by molding a thermoplastic elastomer was fixed further thereto so as to cover the entire surface of the fixed laminated material. The gas permeable area of the laminated material was 3,318 $mm^2$, and it was confirmed separately that the one-way valve 5 opens when the pressure inside the lamp becomes about 2 kPa higher than that of the external environment.

Next, a PTFE resin was mixed with strontium oxide (SrO) and silica gel, serving as the water absorbent 8, and the resultant mixture was extrusion-molded and drawing-processed to form an absorbing layer 6 in which a porous material of PTFE was the base material and the water absorbent 8 was dispersed in the base material.

Next, a laminated material of a second gas permeable membrane 3 (PTFE porous film: "Temish" made by Nitto Denko Corp.) and the just-described absorbing layer 6 was fixed in the hole B of the support body 4 by heat-bonding (the laminated material had a gas permeability of 0.38 $cm^3/min \cdot cm^2$ with a pressure difference of 1 kPa being applied). Thus, a ventilation member 1 (sample 5) was fabricated. The gas permeable area of the laminated material was 1,963 $mm^2$.

-Sample A (Comparative Example)-

Using the same thermoplastic elastomer as used in the sample 1, a support body having one hole (18 mmΦ) for placing a gas permeable membrane was molded by injection molding. Next, the same gas permeable membrane as the first gas permeable membrane 2 in the sample 1 was fixed in the just-mentioned hole by heat-bonding to prepare a sample A. The gas permeable area of the gas permeable membrane fixed was set to be 125 $mm^2$.

-Sample B (Comparative Example)-

The same support body as that used in the sample A was molded by injection molding, and a polyester film was fixed so as to plug the opening of the hole in the molded support body by heat-bonding, to prepare a sample B.

-Sample C (Comparative Example)-

Figure 16:
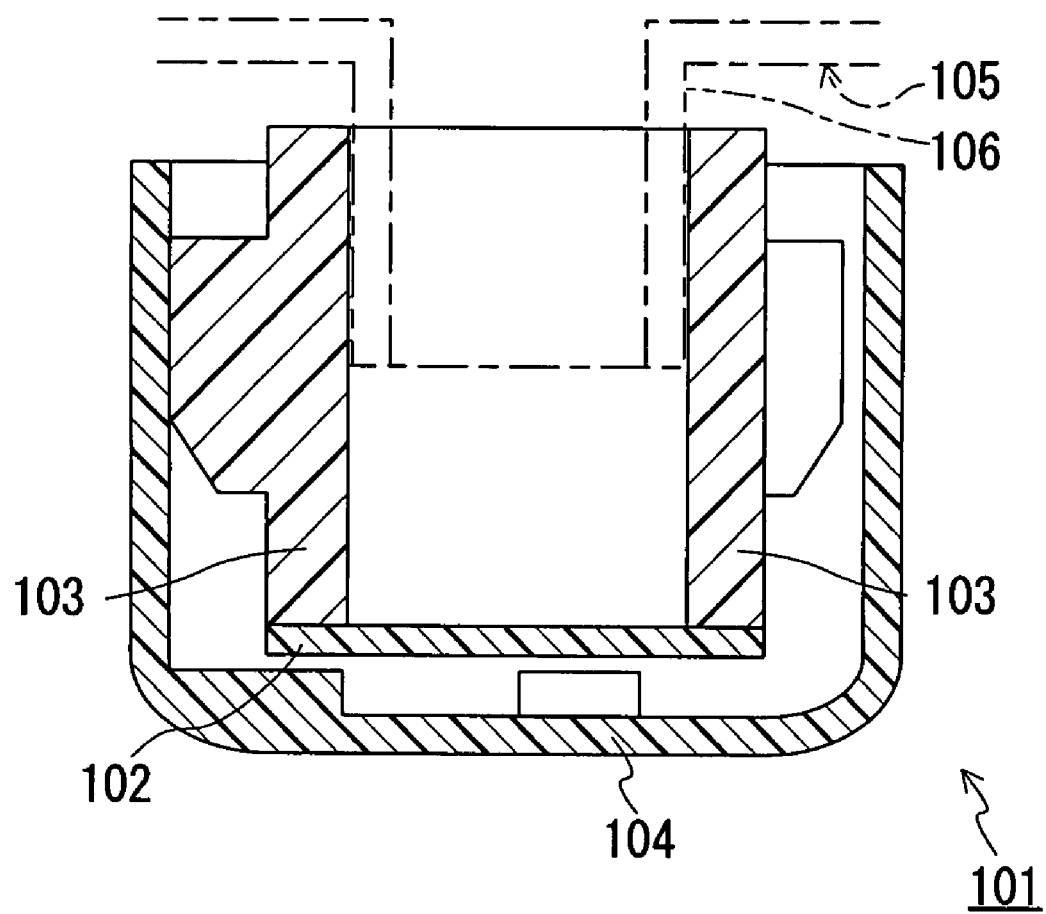
FIG. 16 is a cross-sectional view schematically illustrating one example of a conventional ventilation member.

A ventilation member that has a structure as shown in FIG. 16 was fabricated as a sample C.

First, using the same thermoplastic elastomer as used in the sample 1, a support body having one hole (10 mmΦ) for placing a gas permeable membrane was molded by injection molding. Next, the same gas permeable membrane as the first gas permeable membrane 2 in the sample 1 was fixed on the just-mentioned hole by heat-bonding. Next, a protective cover made of a polypropylene resin was fitted onto the support body. Thus, a ventilation member (sample C) as shown in FIG. 16 was fabricated. The gas permeable area of the gas permeable membrane fixed was set to be 79 $mm^2$.

Figure 15:
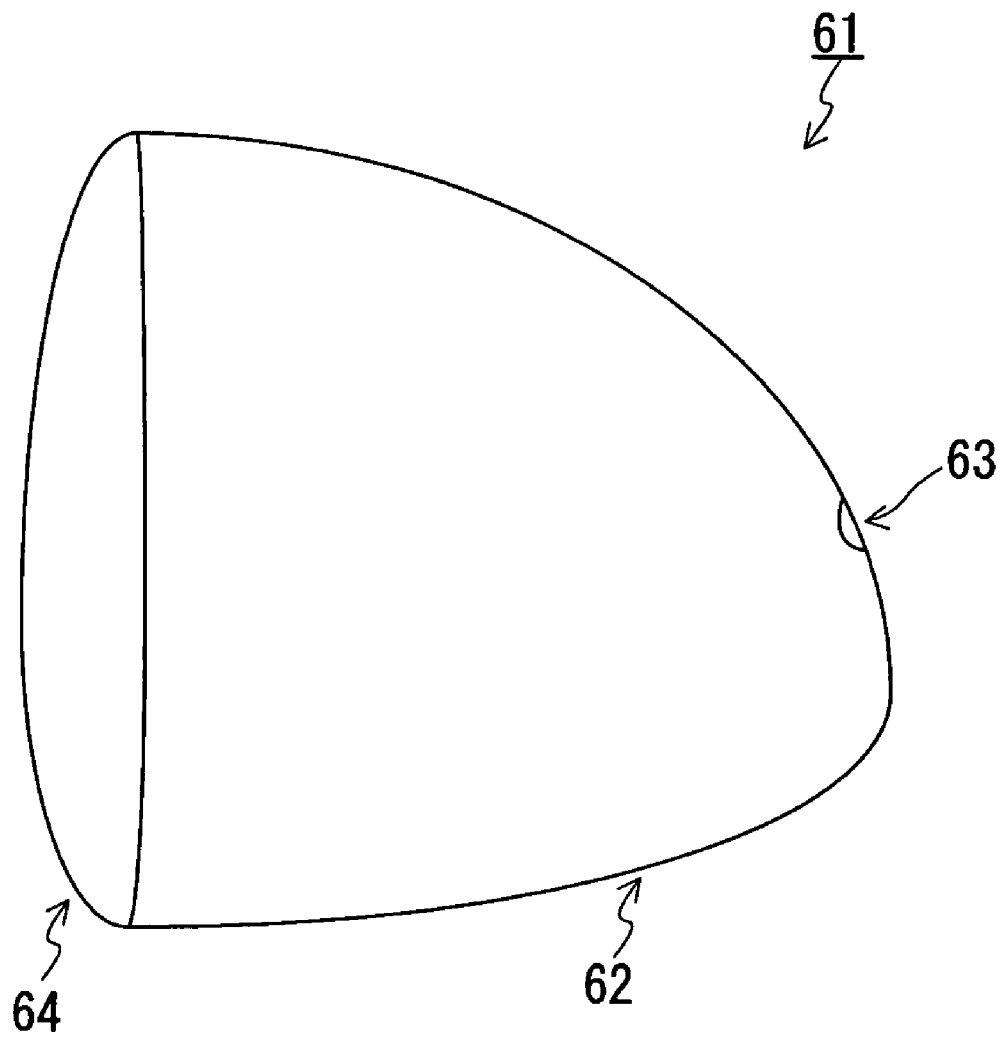
FIG. 15 is a side view for illustrating the shape of an automobile lamp, which is used as a housing in an example.

Each of the samples 1 to 5 and the samples A to C fabricated in these manners was fixed to an opening (fitting hole) 63 of an automobile lamp (lamp) 61 (made by Visteon Corp.: the internal volume of the housing was about 4,000 $cm^2$) shown in FIG. 15 to evaluate the time until fogging will be produced in the lamp 61 (fogging characteristic), the time until the produced fogging will be cleared up when fogging has been produced in the housing (fogging clearing characteristic), and the pressure difference eliminating characteristic. The evaluation methods are described below.

(Evaluation of Fogging Characteristic)

First, the lamp 61 with the opening 63 being open was placed in a dryer and was retained in an atmosphere at 50° C. and 10 to 30% RH (RH: relative humidity) for 5 hours.

Next, each of the ventilation member samples was fixed so as to be inserted in the opening 63, and using a thermostatic chamber capable of setting two different conditions, the lamp 61 was retained for 24 hours in such conditions that a lens unit 64 was in an atmosphere at 5° C. and 50% RH and a main unit 62 was in an atmosphere at 40° C. and 90% RH.

The time until the inner surface of the lens unit 64 started to be fogged after starting to retain the lamp in the chamber was measured, and the time was employed as the fogging characteristic. In the case where no fogging was observed even after the lamp had been retained for 24 hours, it was determined as "no fogging observed."

(Fogging Clearing Characteristic)

Fogging clearing characteristic was evaluated for each of the lamps 61 in which fogging had been produced on the inner surface of the lens unit 64 during the evaluation of the fogging characteristic.

The evaluation was conducted as follows. The lamp 61 was retained in an atmosphere at 25° C. and 50% RH, and wind was applied from the lens unit 64 side to the lamp at a wind speed of 1.7±0.1 m/sec. and a constant volume of air, to measure the time until the fogging produced on the inner surface of the lens unit 64 was cleared up, which was employed as the fogging clearing characteristic. In the case where the fogging produced on the inner surface of the lens unit 64 was not cleared even after 24 hours after the start of the evaluation, it was determined as "unable to fogging clearing."

(Pressure Difference Eliminating Characteristic)

First, each of the ventilation member samples was fixed so as to be inserted in the opening 63 of a lamp 61, and the lamps 61 with the ventilation member samples fixed were retained in an atmosphere at 5° C. for 4 hours.

Next, the temperature of the atmosphere in which the lamps 61 were retained was elevated from 4° C. to 85° C. over a 15 minute period, and then, the difference between the pressure of the interior of the lamp 61 and that of the exterior of the lamp 61 was measured. The case in which the pressure difference exceeded 10 kPa in the temperature increase period is denoted by "X" which means "poor," and the case in which the pressure difference was 10 kPa or less in the period is denoted by a white circle "o" which means "good."

The results of the evaluation are shown in Table 1 below.

TABLE 1

| Sample No. | Fogging characteristic (min.) | Fogging clearing characteristic (min.) | Pressure difference eliminating characteristic |
|---|---|---|---|
| 1 | No fogging observed | — | o |
| 2 | No fogging observed | — | o |
| 3 | No fogging observed | — | o |
| 4 | No fogging observed | — | o |
| 5 | No fogging observed | — | o |
| A (Comparative Example) | 137 | 48 | o |
| B (Comparative Example) | No fogging observed | — | X (Leakage occurred) |
| C (Comparative Example) | 154 | 42 | o |

As shown in Table 1, no fogging was produced on the inner surface of the lens unit 64 of the samples 1 to 5, unlike the samples A and C. Moreover, each of these samples showed a good pressure difference eliminating characteristic, unlike the sample B. In the sample B, the pressure difference became too large, causing leakage in the lamp 61.

In addition, when drops of n-dodecane and ethyl alcohol were dropped separately onto the gas permeable membrane subjected to an oil repellent treatment in each of the ventilation member samples, it was observed that no dropped liquid infiltrated into the gas permeable membrane in both cases of n-dodecane and ethyl alcohol. In contrast, when drops of n-dodecane and ethyl alcohol were dropped separately onto the gas permeable membrane that was not subjected to an oil repellent treatment, it was observed that the dropped liquid infiltrated into the gas permeable membrane in both cases of n-dodecane and ethyl alcohol.

The present invention is applicable to various other embodiments unless they depart from the intentions and the essential features of the invention. The embodiments disclosed herein are purely illustrative and not in any sense limiting. The scope of the invention is defined by the appended claims, not by the description, and all the modifications and equivalents to the claims are intended to be included within the scope of the invention.

INDUSTRIAL APPLICABILITY

The present invention makes it possible to provide a ventilation member and a ventilation member kit that can extend the time until fogging will be produced in a housing and also can shorten the time until the produced fogging will be cleared up even when the interior of the housing has been fogged. In addition, the invention makes it possible to provide a vented housing that can extend the time until fogging will be produced in the housing and can clear the fogging up quickly even when fogging has been produced.

In addition, the present invention makes it possible to provide a ventilation member and a ventilation member kit that can reduce the amount of water vapor that enters the interior of a tank and can discharge a gas in the tank to the exterior of the tank quickly when the pressure inside the tank increases.

The ventilation member (ventilation member kit) according to the present invention may be used for various housings or tanks without any particular limitations. Examples of the vented housing using the ventilation member (ventilation member kit) according to the present invention include: automobile lamps such as headlamps, tail lamps, fog lamps, turn indicator lamps, and reversing lamps; automobile electrical components such as motor housings, pressure sensors, pressure switches, and ECUs; electrical components such as batteries and electric double layer capacitors; and electric appliances such as mobile telephones, cameras, electric shavers, electric toothbrushes, indoor lamps, and outdoor lamps. Examples of the vented tank that employs the ventilation member (ventilation member kit) according to the present invention include various bottles for chemicals, organic solvent tanks, and gas tanks.

The invention claimed is:

1. A ventilation member comprising:

a first gas permeable membrane, a second gas permeable membrane, and an absorbing layer allowing a gas passing through an opening of a housing or a tank to permeate therethrough, with the ventilation member being fixed to the opening;

a support body, having a first hole and a second hole that are independent from each other and penetrate through the support body, for supporting the first gas permeable membrane, the second gas permeable membrane, and the absorbing layer; and a first one-way valve, wherein:

the first gas permeable membrane and the second gas permeable membrane are disposed in such a manner that the gas permeates through the gas permeable membranes independently of each other;

the first gas permeable membrane and the first one-way valve are placed in the first hole in such manner that the first one-way valve covers the first gas permeable membrane;

the second gas permeable membrane and the absorbing layer are placed in the second hole in such a manner that the gas permeates through the second gas permeable membrane and the absorbing layer successively;

the gas flow direction of the first one-way valve is a direction in which the gas passes from the interior to the exterior of the housing or the tank when the ventilation member is fixed to the opening;

the gas passes from the exterior to the interior through the second hole when the interior is under a negative pressure condition relative to the exterior;

part of the gas passes from the interior to the exterior without permeating the absorbing layer when the interior is under a pressurized condition relative to the exterior;

the first and the second gas permeable membranes comprise a porous material of fluororesin; and the absorbing layer contains a water absorbent.

2. The ventilation member according to claim 1, wherein the first one-way valve is made of an elastic material.

3. The ventilation member according to claim 1, wherein the absorbing layer is disposed in Contact with the second gas permeable membrane.

4. The ventilation member according to claim 1, wherein the absorbing layer is disposed so as to be sandwiched by a pair of the second gas permeable membranes.

5. The ventilation member according to claim 1, wherein the absorbing layer contains a binder resin serving as a base material for retaining the shape of the absorbing layer.

6. The ventilation member according to claim 1, wherein the water absorbent includes at least one material selected from the group consisting of a material that physically adsorbs moisture and a material that chemically reacts with moisture.

7. The ventilation member according to claim 6, wherein the water absorbent is at least one substance selected from the group consisting of silica, activated carbon, zeolite, alumina, boria, titanium oxide, sepiolite, and activated clay.

8. The ventilation member according to claim 6, wherein the water absorbent is at least one substance selected from the group consisting of alkali metal oxides, alkaline-earth metal oxides, metal sulfates, metal halides, and metallic perchlorate salts.

9. The ventilation member according to claim 1, wherein the water absorbent absorbs a corrosive substance in the atmosphere.

10. The ventilation member according to claim 1, wherein the gas permeability of the first gas permeable membrane with a pressure difference of 10 kPa being applied is within the range of from 50 to 200,000 cm$^3$/min·cm$^2$.

11. The ventilation member according to claim 1, wherein the gas permeable area of the first gas permeable membrane is within the range of from 5 to 5,000 mm$^2$.

12. The ventilation member according to claim 1, wherein the gas permeability of the second gas permeable membrane with a pressure difference of 1 kPa being applied is within the range of from 0.05 to 100 cm$^3$/min·cm$^2$.

13. The ventilation member according to claim 1, wherein the gas permeable area of the second gas permeable membrane is within the range of from 1 to 2,000 mm$^2$.

14. The ventilation member according to claim 1, wherein at least one of the gas permeable selected from the first and the second gas permeable membrane contains a porous polytetrafluoroethylene.

15. The ventilation member according to claim 1, wherein at least one of the gas permeable membrane selected from the first and the second gas permeable membranes is a liquid repellent membrane.

16. A vented housing, having an opening for allowing a gas to pass therethrough, comprising:
a ventilation member according to claim 1, wherein
the ventilation member is fixed to the opening in such a manner that a gas flow direction of the first one-way valve of the ventilation member is a direction in which the gas passes from an interior to an exterior of the housing.

17. A vented tank, having an opening for allowing a gas to pass therethrough, comprising:
a ventilation member according to claim 1, wherein
the ventilation member is fixed to the opening in such a manner that a gas flow direction of the first one-way valve of the ventilation member is a direction in which the gas passes from an interior to an exterior of the housing.

18. A ventilation member kit comprising:
a first ventilation member comprising a first gas permeable membrane allowing a gas passing through a first opening of a housing or a tank to permeate therethrough, when the first ventilation member is fixed to the first opening, a first support body for supporting the first gas permeable membrane, and a first one-way valve disposed so as to cover the first gas permeable membrane; and
a second ventilation member comprising a second gas permeable membrane and an absorbing layer allowing a gas passing through a second opening of the housing or the tank to permeate therethrough, when the second ventilation member is fixed to the second opening, and a second support body for supporting the second gas permeable membrane and the absorbing layer, wherein
in the second ventilation member, the second gas permeable membrane and the absorbing layer are disposed in such a manner that the gas permeates through the second gas permeable membrane and the absorbing layer successively;
the gas flow direction of the first one-way valve is a direction in which the gas passes from the interior to the exterior of the housing or the tank when the first ventilation member is fixed to the first opening;
the gas passes from the exterior to the interior through the second ventilation member when the interior is under a negative pressure condition relative to the exterior;
part of the gas passes from the interior to the exterior without permeating the absorbing layer when the interior is under a pressurized condition relative to the exterior;
the first and the second gas permeable membranes comprises a porous material of fluororesin; and
the absorbing layer contains a water absorbent.

19. A vented housing, having first and second openings for allowing a gas to pass therethrough, comprising:
a ventilation member kit according to claim 18, wherein
the first ventilation member of the ventilation member kit is fixed to the first opening in such a manner that a gas flow direction of the first one-way valve of the first ventilation member is a direction in which the gas passes from an interior to an exterior of the housing; and
the second ventilation member of the ventilation member kit is fixed to the second opening.

20. A vented tank, having first and second openings for allowing a gas to pass therethrough, comprising:
a ventilation member kit according to claim 18, wherein
the first ventilation member of the ventilation member kit is fixed to the first opening in such a manner that a gas flow direction of the first one-way valve of the first ventilation member is a direction in which the gas passes from an interior to an exterior of the tank; and
the second ventilation member of the ventilation member kit is fixed to the second opening.

* * * * *

UNITED STATES PATENT AND TRADEMARK OFFICE
CERTIFICATE OF CORRECTION

| | | |
|---|---|---|
| PATENT NO. | : 8,069,875 B2 | |
| APPLICATION NO. | : 11/921473 | |
| DATED | : December 6, 2011 | |
| INVENTOR(S) | : Mashiko | |

It is certified that error appears in the above-identified patent and that said Letters Patent is hereby corrected as shown below:

Column 21, line 18 (claim 3): "in Contact with" should read --in contact with--.

Signed and Sealed this
Twenty-seventh Day of March, 2012

David J. Kappos
*Director of the United States Patent and Trademark Office*